(12) United States Patent
Wang et al.

(10) Patent No.: US 11,057,154 B2
(45) Date of Patent: Jul. 6, 2021

(54) METHOD AND APPARATUS FOR RATE MATCHING INTERLEAVING FOR POLAR CODES

(71) Applicant: NTT DOCOMO, INC., Tokyo (JP)

(72) Inventors: Runxin Wang, Beijing (CN); Chongning Na, Beijing (CN); Satoshi Nagata, Tokyo (JP)

(73) Assignee: NTT DOCOMO, INC., Tokyo (JP)

(*) Notice: Subject to any disclaimer, the term of this patent is extended or adjusted under 35 U.S.C. 154(b) by 0 days.

(21) Appl. No.: 16/638,527

(22) PCT Filed: Aug. 10, 2018

(86) PCT No.: PCT/CN2018/099833
§ 371 (c)(1),
(2) Date: Feb. 12, 2020

(87) PCT Pub. No.: WO2019/033991
PCT Pub. Date: Feb. 21, 2019

(65) Prior Publication Data
US 2020/0374038 A1    Nov. 26, 2020

(30) Foreign Application Priority Data
Aug. 15, 2017  (CN) .......................... 201710698603.7

(51) Int. Cl.
*H04L 1/00* (2006.01)
(52) U.S. Cl.
CPC ............ *H04L 1/0071* (2013.01); *H04L 1/003* (2013.01); *H04L 1/0013* (2013.01); *H04L 1/0057* (2013.01)

(58) Field of Classification Search
CPC ............. H03M 13/2792; H03M 13/27; H03M 13/2778; H04L 1/0071; H04L 1/0013; H04L 1/003; H04L 1/0057; H04L 1/0067; H04L 1/1867
See application file for complete search history.

(56) References Cited

U.S. PATENT DOCUMENTS

| 2008/0301536 | A1* | 12/2008 | Shin | ...................... | H04L 1/0071 |
| | | | | | 714/786 |
| 2013/0139023 | A1* | 5/2013 | Han | .................... | H03M 13/635 |
| | | | | | 714/752 |
| 2017/0012740 | A1* | 1/2017 | Shen | ...................... | H04L 1/0067 |
| 2018/0367239 | A1* | 12/2018 | Jang | ....................... | H04L 1/0068 |

(Continued)

FOREIGN PATENT DOCUMENTS

EP        3 584 974 A1    12/2019

OTHER PUBLICATIONS

Extended European Search Report in counterpart European Application No. 18846673.4 dated Apr. 20, 2021 (11 pages).

(Continued)

*Primary Examiner* — Sophia Vlahos
(74) *Attorney, Agent, or Firm* — Osha Bergman Watanabe & Burton LLP

(57) ABSTRACT

A method and an apparatus for rate matching interleaving for polar codes are provided. The method includes: obtaining a first codeword bit sequence; dividing the first codeword bit sequence to obtain one or more segments; performing intra-segment and/or inter-segment interleaving on the one or more segments to generate an interleaved bit sequence.

4 Claims, 11 Drawing Sheets

(56) References Cited

U.S. PATENT DOCUMENTS

2020/0021393 A1* 1/2020 Noh .................... H04L 1/0061
2020/0119846 A1* 4/2020 Wang ................ H03M 13/2707
2020/0169351 A1* 5/2020 Yoshimura ............ H04L 5/0055

OTHER PUBLICATIONS

NTT Docomo; "Interleaving design of Polar codes"; 3GPP TSG RAN WG1 NR Ad-Hoc#2, R1-1711128; Qingdao, China; Jun. 27-30, 2017 (6 pages).

LG Electronics; "Design of polar codes with high order modulations"; 3GPP TSG RAN WG1 NR Ad-Hoc#2, R1-1710348; Qingdao, China; Jun. 27-30, 2017 (5 pages).

* cited by examiner

First coded information bit sequence

| 301 a | 302 a | 303 a | 304 a | 305 a | 306 a | 307 a | 308 a | 309 a | 310 a | 311 a | 312 a | 313 a | 314 a | 315 a | 316 a |

First segment: 301, 302
Second segment: 303, 304, 305
Third segment: 306, 307, 308
Fourth segment: 309, 310, 311, 312
Fifth segment: 313, 314, 315, 316

Second coded information bit sequence

| 301 b | 302 b | 303 b | 304 b | 305 b | 306 b | 307 b | 308 b |

First segment: 301, 302
Second segment: 303, 304, 305
Third segment: 306, 307, 308

FIG. 3

$$\begin{pmatrix} 1 & & & & & & & \\ 1 & 1 & & & & & & \\ 1 & & 1 & & & & & \\ 1 & 1 & 1 & 1 & & & & \\ 1 & & & & 1 & & & \\ 1 & 1 & & & 1 & 1 & & \\ 1 & & 1 & & 1 & & 1 & \\ 1 & 1 & 1 & 1 & 1 & 1 & 1 & 1 \end{pmatrix}$$

METHOD AND APPARATUS FOR RATE MATCHING INTERLEAVING FOR POLAR CODES

CROSS-REFERENCE TO RELATED APPLICATIONS

This application is a 371 U.S. National Phase of International Application No. PCT/CN2018/099833, filed on Aug. 10, 2018, which claims priority to Chinese Application No. 201710698603.7, filed on Aug. 15, 2017. The entire disclosures of the above applications are incorporated herein by reference.

TECHNICAL FIELD

The present disclosure relates to a field of wireless communication, and in particular, to a method and an apparatus for the rate matching interleaving for polar codes in a wireless communication system.

BACKGROUND

In order to improve a channel capacity of wireless communication, a method of encoding an information bit sequence by using polar codes has been proposed. Specifically, the polar codes may be used to encode the information bit sequence to obtain a codeword bit sequence, and then the codeword bit sequence is subjected to channel interleaving and modulation.

However, in existing communication systems, the encoded information bit sequence is subjected to channel interleaving and modulation as a whole. This results in that as a length of the information bit sequence increases, a length of the codeword bit sequence also increases. Accordingly, the implementation of wireless communication systems will become more complicated, and the performance of the wireless communication systems, such as a bit error rate, will become lower.

SUMMARY OF THE DISCLOSURE

According to one aspect of the present disclosure, a rate matching interleaving method for polar codes is provided. The method comprises: obtaining a first codeword bit sequence; dividing the first codeword bit sequence to obtain one or more segments; and performing intra-segment and/or inter-segment interleaving on the one or more segments to generate an interleaved bit sequence.

According to one aspect of the present disclosure, a rate matching interleaving apparatus for polar codes is provided. The apparatus comprises: an obtaining unit configured to obtain a first codeword bit sequence; a segmenting unit configured to divide the first codeword bit sequence to obtain one or more segments; and a processing unit configured to perform intra-segment and/or inter-segment interleaving on the one or more segments to generate an interleaved bit sequence.

Method and apparatus for the rate matching interleaving for polar codes according to the above aspects of the present disclosure simplify the implementation of wireless communication systems and improve performance, such as a bit error rate, of the wireless communication systems by segmenting the first codeword bit sequence and performing intra-segment and/or inter-segment interleaving on the obtained segments.

BRIEF DESCRIPTION OF THE DRAWINGS

In order to explain the technical solutions of embodiments of the present disclosure more clearly, the accompanying drawings used in the description of the embodiments are briefly introduced below. Obviously, the accompanying drawings in the following description are merely some embodiments of the present disclosure, and those skilled in the art can also obtain other accompanying drawings according to these accompanying drawings without creative labor.

FIG. 2 shows a schematic diagram of segmenting a first codeword bit sequence and a second codeword bit sequence according to a predetermined segmentation pattern;

FIG. 3 shows another schematic diagram of segmenting a first codeword bit sequence and a second codeword bit sequence according to a predetermined segmentation pattern;

FIG. 6A shows a schematic diagram of an initial matrix of 8×8;

FIG. 6B shows a schematic diagram of generating a reduction matrix from the initial matrix of 8×8 shown in FIG. 6A;

DESCRIPTION OF THE EMBODIMENTS

Figure 1:
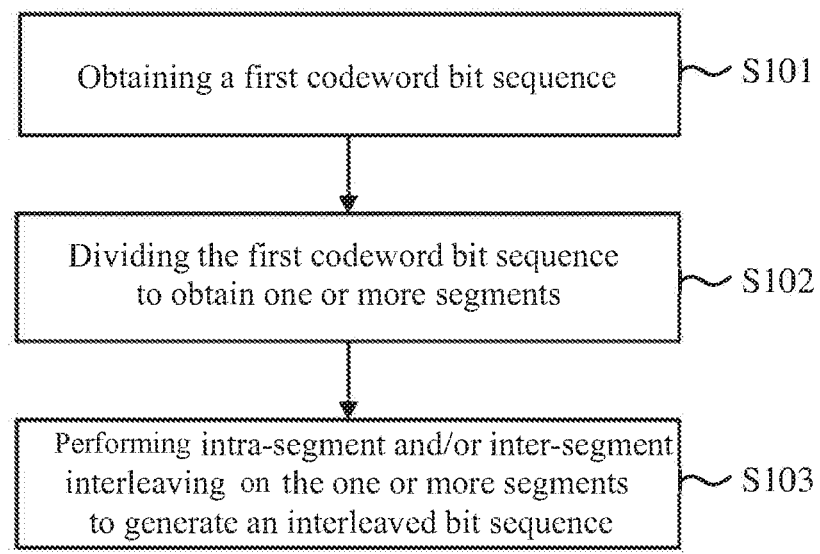
FIG. 1 shows a flowchart of a rate matching interleaving method for polar codes according to one embodiment of the present disclosure.

A method and an apparatus for rate matching interleaving for polar codes according to embodiments of the present disclosure will be described below with reference to the accompanying drawings. The same reference numerals denote the same elements throughout the accompanying drawings. It should be understood that the embodiments described herein are merely illustrative and should not be construed as limiting the scope of the disclosure. In addition, the rate matching interleaving method for the polar codes may be performed by a base station or a user equipment (UE), and the interleaving apparatus for the polar codes may be the base station or the user equipment. In addition, the base station may be a fixed station, a NodeB, an eNodeB (eNB), an access point, a transmitting point, a receiving point, a femto cell, a small cell, and the like, which are not limited herein. In addition, the user equipment described herein may include various types of user equipment, such as a mobile terminal (also referred to as mobile station) or a fixed terminal. However, for convenience, the UE and the mobile station are sometimes used interchangeably in the following.

According to the method and apparatus for the rate matching interleaving for polar codes provided according to the embodiments of the present disclosure, a codeword bit sequence is segmented before channel interleaving and modulation are performed on the codeword bit sequence, so that the wireless communication system may process one or more segments with a shorter length rather than one codeword bit sequence with a longer length, thereby simplifying the implementation of the wireless communication system. In addition, after the codeword bit sequence is segmented, intra-segment or inter-segment interleaving is performed on one or more segments, which reduces burst errors in bit transmission and improves the performance of the wireless communication system, such as a bit error rate.

Hereinafter, a rate matching interleaving method for polar codes according to one embodiment of the present disclosure is described with reference to FIG. 1. FIG. 1 shows a flowchart of a rate matching interleaving method 100 for polar codes.

As shown in FIG. 1, in step S101, a first codeword bit sequence is obtained.

According to one example of the embodiment, the first codeword bit sequence in step S101 may be a codeword bit sequence output by a Polar encoder. For example, the Polar encoder encodes an information bit sequence to generate the codeword bit sequence (also referred to as a mother code codeword bit sequence for a polar code).

Figure 11:
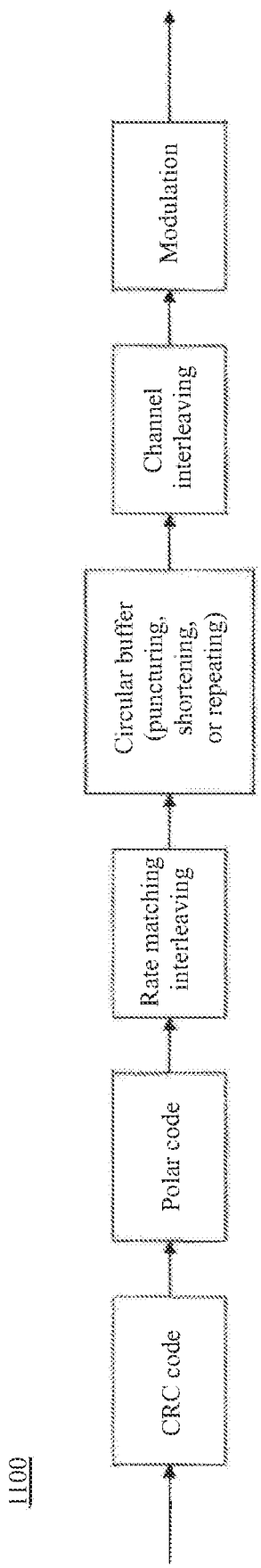
FIG. 11 shows a schematic diagram of performing Polar coding, rate matching, channel interleaving, and modulation for an information bit sequence according to one embodiment of the present disclosure.

FIG. 11 shows a schematic diagram of performing polar coding, rate matching, channel interleaving, and modulation on the information bit sequence according to one embodiment of the present disclosure. As shown in FIG. 11, the CRC-encoded information bit sequence enters the Polar encoder. The Polar encoder encodes the information bit sequence to generate a codeword bit sequence, and the rate matching is performed on the codeword bit sequence by using rate matching schemes and then the channel interleaving and modulation is performed on the codeword bit sequence. In practical applications, the rate matching schemes may include puncturing, shortening, and repeating the codeword bit sequence and the like. The difference between these different rate matching schemes may be reflected in the different starting and ending points of the circular buffer output. However, the present disclosure is not limited to this.

According to one example of the embodiment, in the example shown in FIG. 11, when a codeword bit sequence of length P is given, an order for rate matching interleaving is constant for different rate matching schemes.

Figure 12:
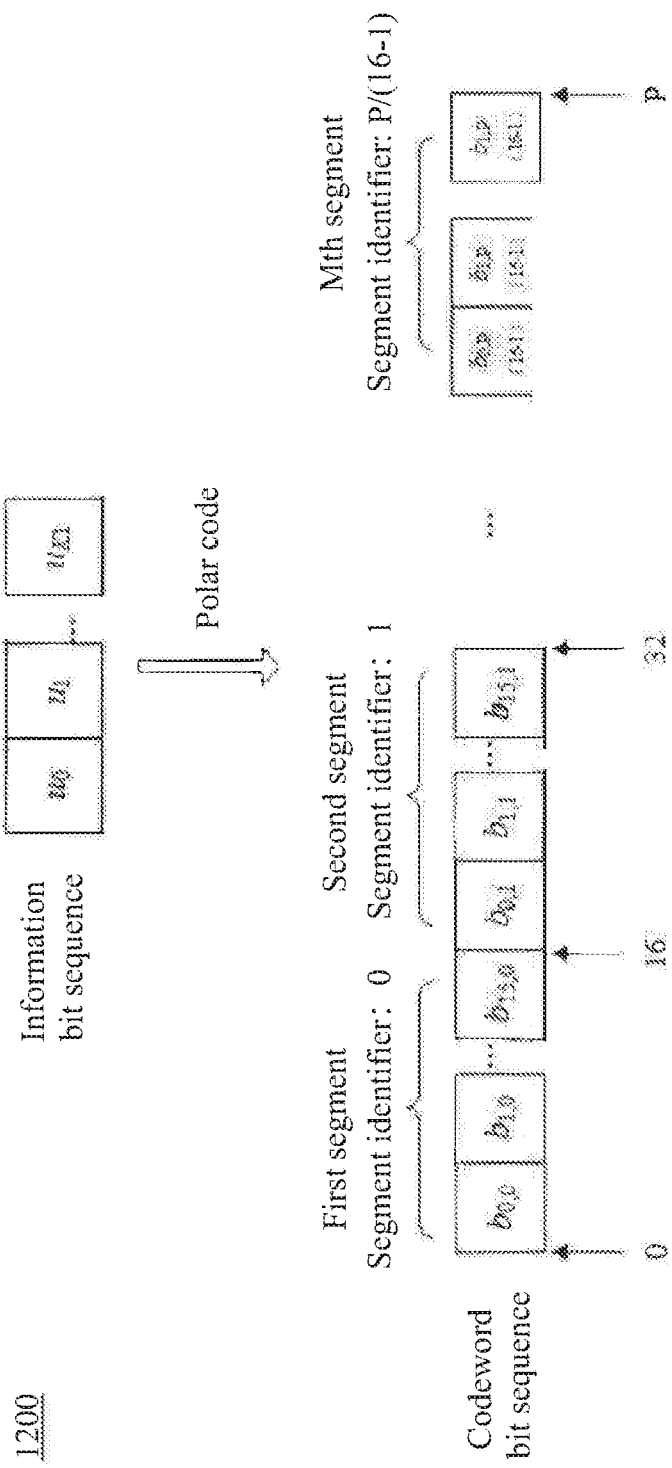
FIG. 12 shows a schematic diagram in which a Polar encoder encodes an information bit sequence to generate a codeword bit sequence and performs rate matching interleaving on the codeword bit sequence.

FIG. 12 shows a schematic diagram in which a Polar encoder encodes the information bit sequence to generate the codeword bit sequence and performs rate matching interleaving on the codeword bit sequence. As shown in FIG. 12, the information bit sequence is $u_0, u_1, \ldots, u_{k1}$. After the information bit sequence enters the Polar encoder, the Polar encoder encodes the information bit sequence to generate the codeword bit sequence of length P.

According to one example, the first codeword bit sequence in step S101 may include a plurality of bits. For example, the first codeword bit sequence may include 8 bits, or 16 bits, and so on.

Then, in step S102, the first codeword bit sequence is divided to obtain one or more segments.

For example, in the example shown in FIG. 12 described above, the codeword bit sequence of length P is divided into M segments, where a segment identifier of a first segment is 0 and a segment identifier of a second segment is 1, ..., a segment identifier of a $M^{th}$ segment is P/(16-1). After segmenting, each segment includes 16 bits, and sequence numbers of the 16 bits are respectively 0 to 15.

According to one example of the embodiment, in step S102, the dividing the first codeword bit sequence to obtain one or more segments may include: dividing the first codeword bit sequence according to a predetermined segmentation pattern to obtain one or more segments, where the number of bits included in the one or more segments is identical to the number of bits included in corresponding segments obtained by dividing a second codeword bit sequences according to the predetermined segmentation pattern, and the length of the first codeword bit sequence is different from the length of the second codeword bit sequence.

In this example, the predetermined segmentation pattern may be a predetermined number of bits included in respective segments. For example, in step S102, the first codeword bit sequence or the second codeword bit sequence is divided according to the predetermined number of bits included in respective segments to obtain one or more segments. After division, the number of bits included in the respective segments may be the same or different.

Figure 2:
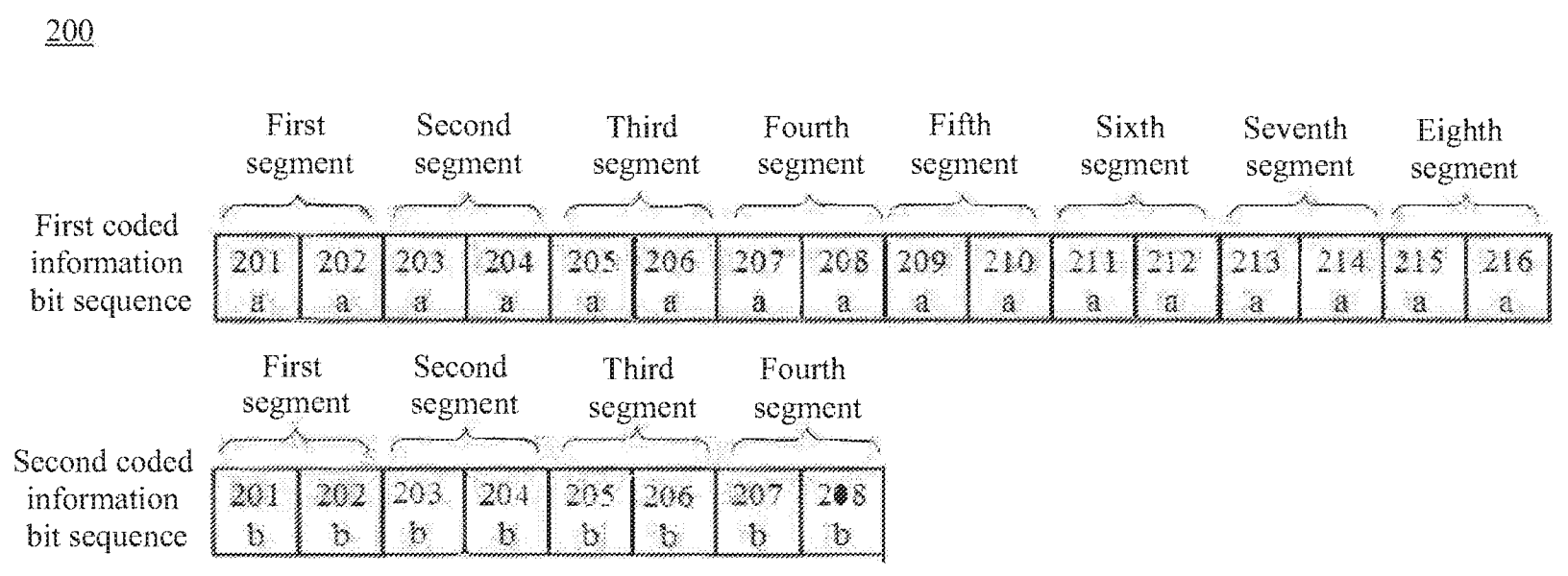

The following will further describe a case where segmenting is performed according to the predetermined segmentation pattern and the number of bits included in respective segments of the same codeword bit sequence after the division is same in combination with FIG. 2.

FIG. 2 shows a schematic diagram of segmenting the first codeword bit sequence and the second codeword bit sequence according to the predetermined segmentation pattern. As shown in FIG. 2, it is assumed that the number of bits included in the respective segments is predetermined to be the same, for example, the number of bits is 2. When the first codeword bit sequence with a length of 16 (that is, including 16 bits, 201a to 216a) is obtained in step S101, then in step S102, 8 segments may be obtained by dividing the first codeword bit sequence according to the predetermined number of bits included in the respective segments, where the first segment includes 2 bits, the second segment includes 2 bits, ..., and the eighth segment includes 2 bits. However, for the second codeword sequence bits with a length of 8 (that is, including 8 bits 201b to 208b), 4 segments may be obtained by dividing the second codeword bit sequence according to the predetermined number of bits included in respective segments, where the first segment includes 2 bits, the second segment includes 2 bits, ..., and the fourth segment includes 2 bits. It can be seen that no matter whether the first codeword bit sequence obtained in step S101 includes 16 bits or 8 bits, when the first codeword bit sequence is divided according to the predetermined segmentation pattern to obtain segments, the number of bits included in each segment of the first codeword bit sequence is the same.

In the example shown above in combination with FIG. 2, the codeword bit sequence is divided on the basis of each segment including 2 bits. However, in the embodiments according to the present disclosure, the number of bits included in the respective segments is not limited to this. For example, when the codeword bit sequence is divided, the codeword bit sequence may be divided on the basis of each segment including 16 bits.

In addition, the following describes a case where segmenting is performed according to the predetermined segmentation pattern and the number of bits included in the respective segments of the same codeword bit sequence after the division is different in combination with FIG. 3.

FIG. 3 shows another schematic diagram of segmenting the first codeword bit sequence and the second codeword bit sequence according to the predetermined segmentation pattern. As shown in FIG. 3, it is assumed that the number of bits included in the respective segments is different. For example, the first segment includes 2 bits, the second segment includes 4 bits, the third segment includes 2 bits, the fourth segment include 4 bits, the fifth segment includes 4 bits and the like. When the first codeword bit sequence with the length of 16 (that is, including 16 bits, 301*a* to 316*a*) is obtained in step S101, in step S102, 5 segments may be obtained by dividing the first codeword bit sequence according to the predetermined number of bits included in the respective segments, where the first segment includes 2 bits, the second segment includes 4 bits, the third segment includes 2 bits, the fourth segment includes 4 bits, and the fifth segment includes 4 bits. However, for the second codeword sequence bit with the length of 8 (that is, including 8 bits, 301*b* to 308*b*), 3 segments may be obtained by dividing the second codeword bit sequence according to the predetermined number of bits included in the respective segments, where the first segment includes 2 bits, the second segment includes 4 bits, and the third segment includes 2 bits. It can be seen that no matter whether the first codeword bit sequence obtained in step S101 includes 16 bits or 8 bits, when the first codeword bit sequence is divided according to the predetermined segmentation pattern to obtain segments, the number of bits included in first segment, the second segment, and third segment of the first codeword bit sequence is different, and the number of bits included in the second segment of the first codeword bit sequence is different from the number of bits included in the first or third segment.

According to another example of the embodiment, in step S102, the dividing the first codeword bit sequence to obtain one or more segments may further include: dividing the first codeword bit sequence to obtain a plurality of segments, where the number of bits included in at least one segment of the plurality of segments is different from the number of bits included in other segments of the plurality of segments.

For example, when the first codeword bit sequence with the length of 8 is obtained in step S101, in step S102, 3 segments may be obtained by dividing the first codeword bit sequence, where the first segment includes 2 bits, the second segment includes 4 bits, and the third segment includes 2 bits.

In this example, in step S102, a first division may be performed on the first codeword bit sequence to obtain a plurality of first segments, where the number of bits included in each first segment is the same. Then, at least two adjacent first segments of the plurality of first segments are merged into one second segment, and then the second segment and other first segments other than the at least two adjacent first segments in the plurality of first segments form a plurality of segments obtained by dividing the first codeword bit sequence. For example, when the first codeword bit sequence with the length of 8 is obtained in step S101, in step S102, the first division may be performed on the first codeword bit sequence with the length of 8 to obtain 4 first segments, where the number of bits included in each of the first segments is 2. The second first segment and the third first segment in the four first segments are merged into one second segment, and then the number of bits included in the second segment is 4. Therefore, the second segment, the first segment and the fourth first segment form 3 segments obtained by dividing the codeword bit sequence with the length of 8.

Then, in step S103, intra-segment and/or inter-segment interleaving are performed on the one or more segments to generate an interleaved bit sequence.

In step S103, intra-segment and/or inter-segment interleaving may be performed on the one or more segments in a plurality of manners to generate the interleaved bit sequence. For example, the segment identifiers of the plurality of segments may be permuted by regular permuting rules to determine an order for inter-segment and/or inter-segment interleaving for one or more segments. As another example, the order for inter-segment and/or inter-segment interleaving for one or more segments may also be determined by a randomly generated order. For another example, for different segments in one or more segments, different manners may also be used to determine the order for inter-segment and/or inter-segment interleaving.

Figure 4:
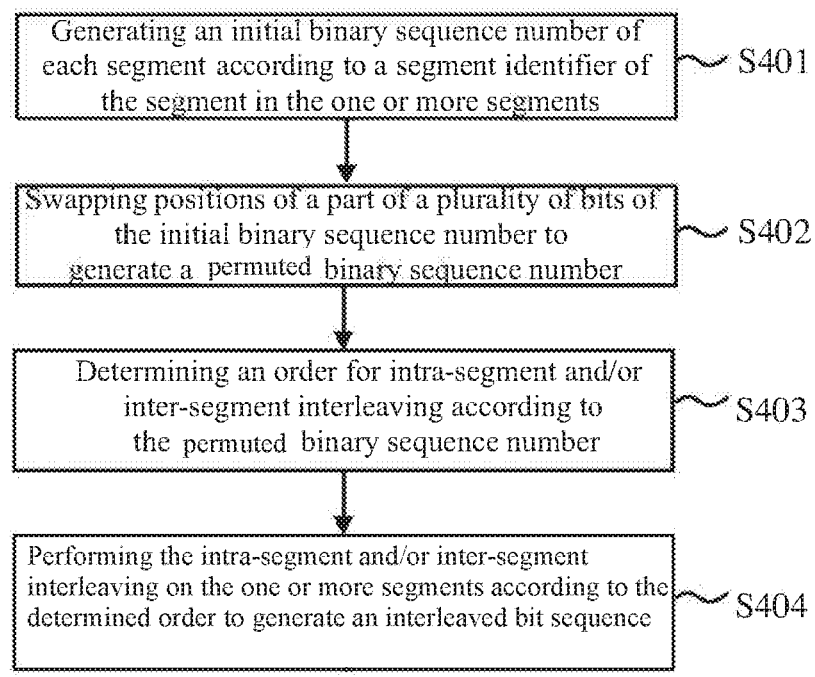
FIG. 4 shows a flowchart of a method for performing intra-segment and/or inter-segment interleaving on the one or more segments to generate an interleaved bit sequence according to one example of present embodiments.

FIG. 4 shows a flowchart of a method 400 for performing intra-segment and/or inter-segment interleaving on the one or more segments to generate the interleaved bit sequence according to one example of present embodiments.

As shown in FIG. 4, in step S401, an initial binary sequence number of each segment is generated according to a segment identifier of the segment in the one or more segments, where each initial binary sequence number includes a plurality of bits.

According to one example of the embodiment, each segment in one or more segments may be assigned a segment identifier, where the segment identifier may be a decimal sequence number. In step S401, the decimal sequence number of each segment is converted into a corresponding binary sequence number.

For example, in step 102 as described above, according to the predetermined segmentation pattern, the codeword bit sequence with the length of 16 is divided and 8 segments are obtained, and the segment identifiers of the 8 segments are respectively [0, 1, 2, 3, 4, 5, 6, 7]. Then in step S401, the segment identifiers of the 8 segments are converted into corresponding binary sequence numbers, which are respectively [000, 001, 010, 011, 100, 101, 110, 111]. That is, the initial binary sequence numbers of the 8 segments are respectively [000, 001, 010, 011, 100, 101, 110, 111], and the initial binary sequence number of each segment includes 3 bits.

Then, in step S402, positions of a part of the plurality of bits of the initial binary sequence number are swapped to generate a permuted binary sequence number.

For example, in the example described above, in step S401, the codeword bit sequence with the length of 16 is divided and 8 segments are obtained, and the initial binary sequence number of each segment includes 3 bits. Then in step S402, the positions of the first bit and second bit of the 3 bits of the initial binary sequence number of each segment are swapped to generate the permuted binary sequence number. That is, the permuted binary sequence numbers of the 8 segments are respectively [000, 001, 100, 101, 010, 011, 110, 111].

Then, in step S403, the order for inter-segment and/or inter-segment interleaving is determined according to the permuted binary sequence number.

For example, in step S402 as described above, the generated permuted binary sequence numbers of the 8 segments are respectively [000, 001, 100, 101, 010, 011, 110, 111]. Then in step S403, the order for inter-segment and/or inter-segment interleaving may be determined according to the decimal sequence numbers [0, 1, 4, 5, 2, 3, 6, 7] corresponding to the permuted binary sequence numbers. Of course, the order for inter-segment and/or inter-segment interleaving may also be directly determined according to the permuted binary sequence numbers, which is not limited in the present disclosure.

Then, in step S404, intra-segment and/or inter-segment interleaving is performed on the one or more segments according to the determined order to generate the interleaved bit sequence.

For example, in step S403 described above, the determined order is [0, 1, 4, 5, 2, 3, 6, 7]. Then in step S404, intra-segment and/or inter-segment interleaving is performed on the 8 segments according to the order [0, 1, 4, 5, 2, 3, 6, 7] to generate the interleaved bit sequence. The above description has been made based on the example of swapping two bits of the plurality of bits of the initial binary sequence number, however the present disclosure is not limited to this. Alternatively, more bits among the plurality of bits of the initial binary sequence number may be swapped.

For example, in the above described example of dividing the codeword bit sequence with the length of 16 and obtaining 8 segments, all 3 bits included in the binary sequence number may be swapped. Specifically, according to step S402, the positions of the first bit and the third bit of the 3 bits of each initial binary sequence number may be swapped first, and then the positions of the second bit and the third bit may be swapped to generate the permuted binary sequence number. That is, the permuted binary sequence numbers of the 8 segments are respectively [000, 100, 001, 101, 010, 110, 011, 111].

Then, according to step S403, the order for intra-segment and/or inter-segment interleaving may be determined according to the decimal sequence numbers [0, 4, 1, 5, 2, 6, 3, 7] corresponding to the permuted binary sequence numbers. Then, according to step S404, intra-segment and/or inter-segment interleaving is performed on the 8 segments according to the order [0, 4, 1, 5, 2, 6, 3, 7] to generate the interleaved bit sequence.

The above description has been made by taking the initial binary sequence number including 3 bits and swapping the first and second bit of the 3 bits to determine the order for intra-segment and/or inter-segment interleaving, and the initial binary sequence number including 3 bits and swapping the first and third bit first, and then swapping the second and third bit to determine the order for intra-segment and/or inter-segment interleaving as examples. It should be understood that when the initial binary sequence number includes 3 bits, there are 6 manners to swap bits. Accordingly, in step S403, one of the six orders for intra-segment and/or inter-segment interleaving may be obtained. Therefore, in addition to the order [0, 1, 4, 5, 2, 3, 6, 7] and [0, 4, 1, 5, 2, 6, 3, 7] described above, there are other manners to swap the bits of the initial binary sequence numbers. For example, in step S403, the order for intra-segment and/or inter-segment interleaving may also be determined as [0, 1, 2, 3, 4, 5, 6, 7], [0, 2, 1, 3, 4, 6, 5, 7], [0, 2, 4, 6, 1, 1, 3, 5, 7] or [0, 4, 2, 6, 1, 5, 3, 7].

In addition, when the initial binary sequence number includes 4 bits, there are 24 manners to swap bits. Accordingly, in step S403, one of the following 24 orders for intra-segment and/or inter-segment interleaving may be obtained:

[0, 1, 2, 3, 4, 5, 6, 7, 8, 9, 10, 11, 12, 13, 14, 15],
[0, 2, 1, 3, 4, 6, 5, 7, 8, 10, 9, 11, 12, 14, 13, 15],
[0, 1, 4, 5, 2, 3, 6, 7, 8, 9, 12, 13, 10, 11, 14, 15],
[0, 2, 4, 6, 1, 3, 5, 7, 8, 10, 12, 14, 9, 11, 13, 15],
[0, 4, 2, 6, 1, 5, 3, 7, 8, 12, 10, 14, 9, 13, 11, 15],
[0, 4, 1, 5, 2, 6, 3, 7, 8, 12, 9, 13, 10, 14, 11, 15],
[0, 1, 2, 3, 8, 9, 10, 11, 4, 5, 6, 7, 12, 13, 14, 15],
[0, 2, 1, 3, 8, 10, 9, 11, 4, 6, 5, 7, 12, 14, 13, 15],
[0, 1, 4, 5, 8, 9, 12, 13, 2, 3, 6, 7, 10, 11, 14, 15],
[0, 2, 4, 6, 8, 10, 12, 14, 1, 3, 5, 7, 9, 11, 13, 15],
[0, 4, 2, 6, 8, 12, 10, 14, 1, 5, 3, 7, 9, 13, 11, 15],
[0, 4, 1, 5, 8, 12, 9, 13, 2, 6, 3, 7, 10, 14, 11, 15],
[0, 1, 8, 9, 4, 5, 12, 13, 2, 3, 10, 11, 6, 7, 14, 15],
[0, 2, 8, 10, 4, 6, 12, 14, 1, 3, 9, 11, 5, 7, 13, 15],
[0, 1, 8, 9, 2, 3, 10, 11, 4, 5, 12, 13, 6, 7, 14, 15],
[0, 2, 8, 10, 1, 3, 9, 11, 4, 6, 12, 14, 5, 7, 13, 15],
[0, 4, 8, 12, 1, 5, 9, 13, 2, 6, 10, 14, 3, 7, 11, 15],
[0, 4, 8, 12, 2, 6, 10, 14, 1, 5, 9, 13, 3, 7, 11, 15],
[0, 8, 2, 10, 4, 12, 6, 14, 1, 9, 3, 11, 5, 13, 7, 15],
[0, 8, 1, 9, 4, 12, 5, 13, 2, 10, 3, 11, 6, 14, 7, 15],
[0, 8, 4, 12, 2, 10, 6, 14, 1, 9, 5, 13, 3, 11, 7, 15],
[0, 8, 4, 12, 1, 9, 5, 13, 2, 10, 6, 14, 3, 11, 7, 15],
[0, 8, 2, 10, 1, 9, 3, 11, 4, 12, 6, 14, 5, 13, 7, 15],
[0, 8, 1, 9, 2, 10, 3, 11, 4, 12, 5, 13, 6, 14, 7, 15].

FIG. 4 shows the method for determining the interleaving order according to the binary sequence numbers corresponding to the segment identifiers. However, according to the embodiments of the present disclosure, the interleaving order may be determined according to other methods.

Figure 5:
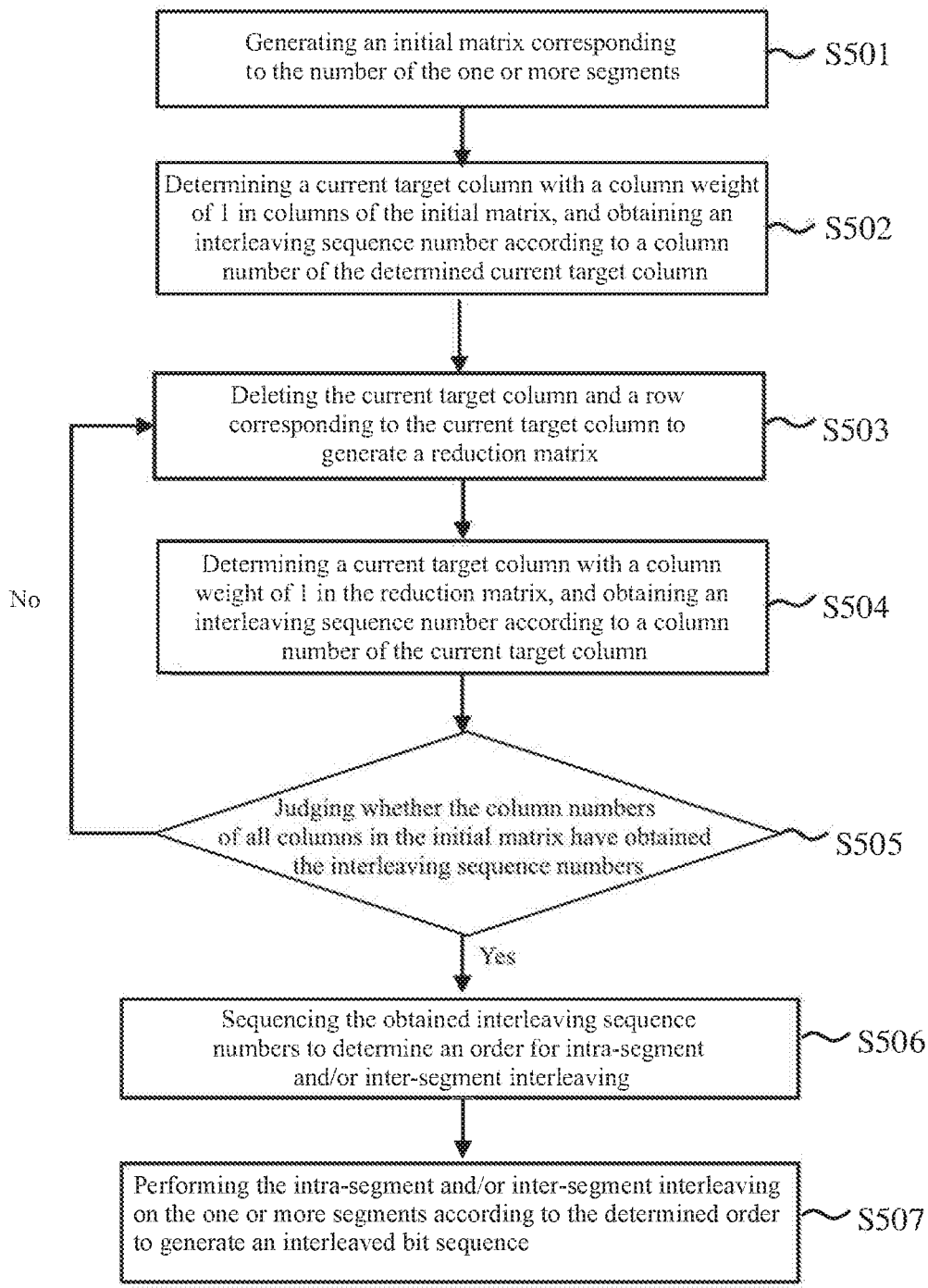
FIG. 5 shows another flowchart of a method for performing intra-segment and/or inter-segment interleaving on the one or more segments to generate an interleaved bit sequence according to one example of present embodiments.

FIG. 5 shows a flowchart of a method 500 for performing intra-segment and/or inter-segment interleaving on the one or more segments to generate the interleaved bit sequence according to another example of present embodiments.

As shown in FIG. 5, in step S501, an initial matrix corresponding to the number of the one or more segments is generated.

In this example, the initial matrix in step S501 may be a generation matrix for the polar codes. For example, according to the number of the one or more segments, a generation matrix used when the polar code encoder encodes an information bit sequence with a length of the number of one or more segments is generated, and then the generation matrix may be used as the initial matrix.

For example, in step 102 as described above, according to the predetermined segmentation pattern, the codeword bit sequence with the length of 16 is divided and 8 segments are obtained, and the polar code encoder uses an 8×8 matrix when encoding the information bit sequence with the length of 8. Then, in step S501, the 8×8 generation matrix is generated, and the 8×8 generation matrix is used as the initial matrix. FIG. 6A shows a schematic diagram of the 8×8 initial matrix, and column numbers 1 to 8 of the 8×8 initial matrix correspond to segment identifiers 0 to 7 of the 8 segments, respectively.

In addition, in this example, the generation manners of the generation matrix may be any generation manners in the prior art, and details are not described herein.

Returning to FIG. 5, in step S502, a current target column with a column weight of 1 in columns of the initial matrix is determined, and an interleaving sequence number is obtained according to a column number of the determined current target column.

For example, in the example shown in FIG. 6A, the 8×8 initial matrix is generated according to step S501. Then in step S502, the current target column with a column weight of 1 in the columns of the initial matrix is determined as the eighth column, and one interleaving sequence number 7 is obtained according to a column number of the eighth column.

Then, in step S503, the current target column and a row corresponding to the current target column are deleted to generate a reduction matrix.

For example, in step S502 as described above, it is determined that the current target column with a column weight of 1 in the columns of the initial matrix is the eighth column. Then in step S503, the eighth column and the eighth row are deleted to generate the reduction matrix. FIG. 6B shows a schematic diagram of generating the reduction matrix from one 8×8 initial matrix. As shown in FIG. 6B, the eighth row and eighth column of the 8×8 initial matrix are deleted to generate a 7×7 reduction matrix.

Returning to FIG. 5, in step S504, the current target column with a column weight of 1 in the reduction matrix is determined, and an interleaving sequence number is obtained according to the column number of the current target column.

For example, in the example shown in FIG. 6B, the 7×7 reduction matrix has been generated. According to step S504, the current target column with a column weight of 1 in the columns of the reduction matrix is determined as the sixth column, and one interleaving sequence number 5 is obtained according to the column number of the sixth column.

Then, in step S505, it is judged whether the column numbers of all columns in the initial matrix have obtained interleaving sequence numbers. If not, the current target column and the row corresponding to the current target column being deleted to generate a reduction matrix, and a current target column with a column weight of 1 in the reduction matrix being determined, and an interleaving sequence number being obtained according to a column number of the current target column are repeatedly. If yes, step S506 is performed.

For example, in the example shown in FIG. 6B, according to step S504, it is determined that the current target column with a column weight of 1 in the columns of the reduction matrix is the sixth column, and then according to step S505, the sixth column and sixth row are deleted to generate a 6×6 reduction matrix. Then, it is determined that the current target column with a column weight of 1 in the columns in the 6×6 reduction matrix is the fourth column, and one interleaving sequence number 3 is obtained according to the column number of the fourth column. The processes of step S503 and step S504 are repeated until the interleaving sequence numbers are obtained according to the column numbers of all the columns in the 8×8 initial matrix.

Then, in step S506, the obtained interleaving sequence numbers are sequentially arranged to determine the order for intra-segment and/or inter-segment interleaving.

For example, in the example shown in combination with FIG. 6A and FIG. 6B above, it is assumed that the interleaving sequence numbers [7, 5, 3, 6, 4, 2, 1, 0] are sequentially obtained according to the initial matrix and the reduction matrixes. Then, in step S506, the interleaving sequence numbers [7, 5, 3, 6, 4, 2, 1, 0] may be arranged in a positive order to determine the order for the intra-segment and/or inter-segment interleaving as [7, 5, 3, 6, 4, 2, 1, 0]. Alternatively, the interleaving sequence numbers [7, 5, 3, 6, 4, 2, 1, 0] may also be arranged in a reverse order to determine the order for the intra-segment and/or inter-segment interleaving as [0, 1, 2, 4, 6, 3, 5, 7].

Then, in step S507, intra-segment and/or inter-segment interleaving is performed on the one or more segments according to the determined order to generate the interleaved bit sequence.

For example, in step S506 as described above, it is determined that the order for intra-segment and/or inter-segment interleaving is [7, 5, 3, 6, 4, 2, 1, 0] or [0, 1, 2, 4, 6, 3, 5, 7]. Then in step S507, the intra-segment and/or inter-segment interleaving may be performed on these eight segments in the order of [7, 5, 3, 6, 4, 2, 1, 0] or [0, 1, 2, 4, 6, 3, 5, 7] to generate the interleaved bit sequence.

In addition, in this example, in steps S502 to 505 as described above, when there are more than one current target columns with a column weight of 1 in the columns of the initial matrix or the reduction matrix, one current target column may be randomly selected, or one current target column may be selected according to certain agreed conditions.

FIG. 4 and FIG. 5 show different methods for determining the interleaving order. However, according to the embodiments of the present disclosure, the interleaving order may be determined according to other methods.

For example, in step S102, the first codeword bit sequence may be divided to obtain N segments, where N is a positive integer greater than or equal to 2. In this case, in step S103, inter-segment interleaving may be performed on the N segments to generate the interleaved bit sequence, where a sum of a segment identifier of the i-th segment and a segment identifier of the (N-i+1)-th segment in the interleaved bit sequence is equal to a sum of a segment identifier of the i-th segment and a segment identifier of the (N-i+1)-th segment before interleaving, and i is a positive integer.

Here is one specific example for illustration. For example, in step S102, the first codeword bit sequence is divided and 16 segments are obtained, and the segment identifiers of the 16 segments are 0 to 15. Then, in step S103, inter-segment interleaving may be performed on the 16 segments according to a predetermined interleaving order, such as [0,1,4,8, 5,2,6,3,12,9,13,10,7,11,14,15], to generate the interleaved bit sequence. Moreover, before interleaving, the sum of the segment identifier "0" of the first segment and the segment identifier ("15") of the sixteenth segment is equal to 15, and the sum of the segment identifier ("1") of the second segment and the segment identifier ("14") of the fifteenth segment is equal to 15, and the sum of the segment identifier ("7") of the eighth segment and the segment identifier ("8") of the ninth segment is equal to 15. After interleaving, the sum of the segment identifier ("0") of the first segment and the segment identifier ("15") of the sixteenth segment in the interleaved bit sequence is still equal to 15, and the sum of the segment identifier ("1") of the second segment and the segment identifier ("14") of the fifteenth segment is still equal to 15, . . . , and the sum of the segment identifier ("3") of the eighth segment and the segment identifier ("12") of the ninth segment is still equal to 15.

In other words, the interleaving order that may ensure the sum of the segment identifier of the i-th segment and the segment identifier of the (N-i+1)-th segment in the interleaved bit sequence after interleaving is the same as that before the interleaving may be the predetermined interleaving order described herein, and the i is a positive integer and N is a positive integer greater than or equal to 2.

In addition, according to another example of the present disclosure, in step S103, intra-segment and/or inter-segment interleaving may also be performed on the one or more segments in other manners different from any manners described above, so as to generate the interleaved bit sequence.

According to another example of the present disclosure, in step S103, intra-segment and/or inter-segment interleaving may be performed on the one or more segments according to a randomly generated order to generate the interleaved bit sequence. In practical applications, the randomly generated order may be an order generated by a random number generator.

According to another example of the present disclosure, in step S103, the order for intra-segment and/or inter-segment interleaving may be determined according to at least a part of an order of frozen bits. Then, intra-segment and/or inter-segment interleaving is performed on the one or more segments according to the determined order to generate the interleaved bit sequence. According to one example of the present disclosure, the frozen bits are bits predetermined by a transmitter and a receiver and used when a polarizer encoder encodes the information bit sequence, and the order of frozen bits may be an arrangement order for the frozen bits.

In this example, in step S103, the order for intra-segment and/or inter-segment interleaving may be determined according to all or a part of the arrangement order for the frozen bits, and then intra-segment and/or inter-segment interleaving is performed on the one or more segments according to the determined order to generate the interleaved bit sequence.

According to another example of the present disclosure, in step S103, the performing intra-segment and/or inter-segment interleaving on the one or more segments to generate an interleaved bit sequence may further comprises: determining the intra-segment and/or inter-segment interleaving order according to the interleaving order used by the interleaved bit sequence that has been interleaved; and performing intra-segment and/or inter-segment interleaving on the one or more segments according to the determined order, to generate an interleaved bit sequence. In practical applications, the interleaving order used by the interleaved interleaving bit sequence that has been interleaved may be stored and then be used to determine the intra-segment and/or inter-segment interleaving order for other codeword bit sequences.

In addition, according to another example of the present disclosure, in step S103, intra-segment interleaving may be performed on the one or more segments to generate the interleaved bit sequence, and an interleaving order for at least a part of segments in the one or more segments is different from an interleaving order for other part of segments in the one or more segments.

For example, for at least a part of segments in the plurality of segments, the interleaving order for the at least a part of segments in the plurality of segments may be determined according to a determination manner different from that of other parts of segments in the plurality of segments. For instance, for the 8 segments obtained in step S102, in step S103, the intra-interleaving order for the 2 segments of the 8 segments may be determined according to one (for example, the process 400 shown in FIG. 4) of the plurality of manners of determining the interleaving order described above. However, for the other 6 segments of the 8 segments, the intra-interleaving order may be determined according to another (for example, the process 500 shown in FIG. 5) of the plurality of manners of determining the interleaving order described above.

In addition, according to another example of the present disclosure, in the case where the first codeword bit sequence is divided to obtain the plurality of segments according to step S102, inter-segment interleaving may be performed on the plurality of segments to generate the interleaved bit sequence according to step S103, and the interleaving order for at least a part of segments in the plurality of segments is different from the interleaving order for other parts of segments in the plurality of segments.

For example, for at least a part of segments in the plurality of segments, the interleaving order for at least a part of segments in the plurality of segments may be determined according to a determination manner different from that of other parts of the plurality of segments. For example, for the 8 segments obtained in step S102, in step S103, the inter-interleaving order for the 4 segments of the 8 segments may be determined according to one (for example, the randomly generated order) of the multiple manners of determining the interleaving order described above. However, for the other 4 segments of the 8 segments, the inter-interleaving order may be determined according to another (for example, at least a part of an order of the frozen bits) of the multiple manners of determining the interleaving order described above.

In addition, according to another example of the embodiments, in step S103, intra-segment interleaving may be performed on the one or more segments to generate the interleaved bit sequence. For example, in the case where the 8 segments are obtained according to step S102, in step S103, intra-segment interleaving may be performed on the one of the 8 segments to generate the interleaved bit sequence. For another example, in the case where the 8 segments are obtained according to step S102, in step S103, intra-segment interleaving may be performed on each of the 8 segments to generate the interleaved bit sequence.

In addition, according to another example of the present disclosure, in the case where the first codeword bit sequence is divided to obtain the plurality of segments according to step S102, in step S103, inter-segment interleaving may be performed on the plurality of segments to generate the interleaved bit sequence, or intra-segment and inter-segment interleaving may be performed on the plurality of segments to generate the interleaved bit sequence.

In this example, the performing intra-segment and inter-segment interleaving on the plurality of segments to generate the interleaved bit sequence may be performing both of intra-segment and inter-segment interleaving on the plurality of segments to generate the interleaved bit sequence in consideration of both intra-segment interleaving order and inter-segment interleaving order at the same time. Alternatively, the performing intra-segment and inter-segment interleaving on the plurality of segments to generate the interleaved bit sequence may also be performing intra-segment interleaving on the plurality of segments according to the intra-segment interleaving order, and then performing inter-segment interleaving on the plurality of segments after intra-segment interleaving according to the inter-segment interleaving order. Alternatively, the performing intra-segment and inter-segment interleaving on the plurality of segments to generate the interleaved bit sequence may also be performing inter-segment interleaving on the plurality of segments according to the inter-segment interleaving order, and then performing intra-segment interleaving on the plurality of segments after inter-segment interleaving according to the intra-segment interleaving order.

Figure 7:
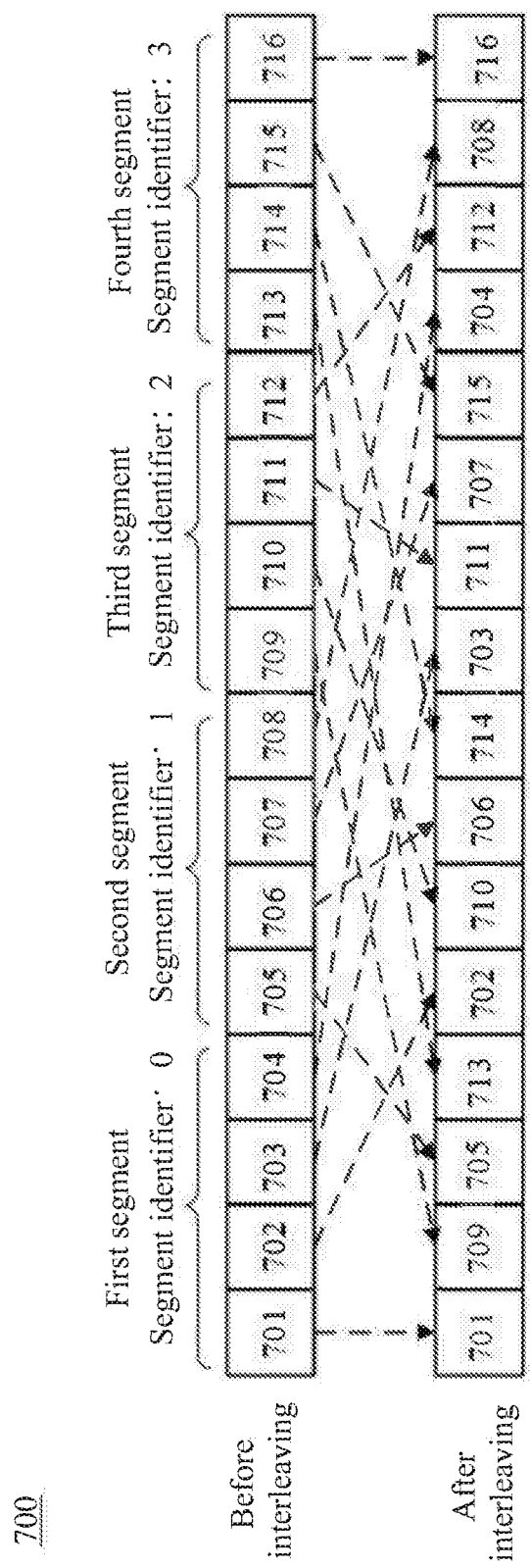
FIG. 7 shows a schematic diagram of performing intra-segment interleaving and inter-segment interleaving on a plurality of segments to generate an interleaved bit sequence.

FIG. 7 shows a schematic diagram of performing intra-segment and inter-segment interleaving on the plurality of segments to generate the interleaved bit sequence in step S103. As shown in FIG. 7, 4 segments are obtained in step S102, and the segment identifiers of the 4 segments are respectively [0, 1, 2, 3]. Each segment includes 4 bits, that is, the first segment includes bits 701 to 704, the second segment includes bits 705 to 708, the third segment includes bits 709 to 712, and the fourth segment includes bits 713 to 716. In step S103, the 4 segments are interleaved in consideration of both inter-segment interleaving order [0, 1, 2, 3] and intra-segment interleaving order [0, 2, 1, 3] at the same time to finally generate the interleaved bit sequence.

Figure 8:
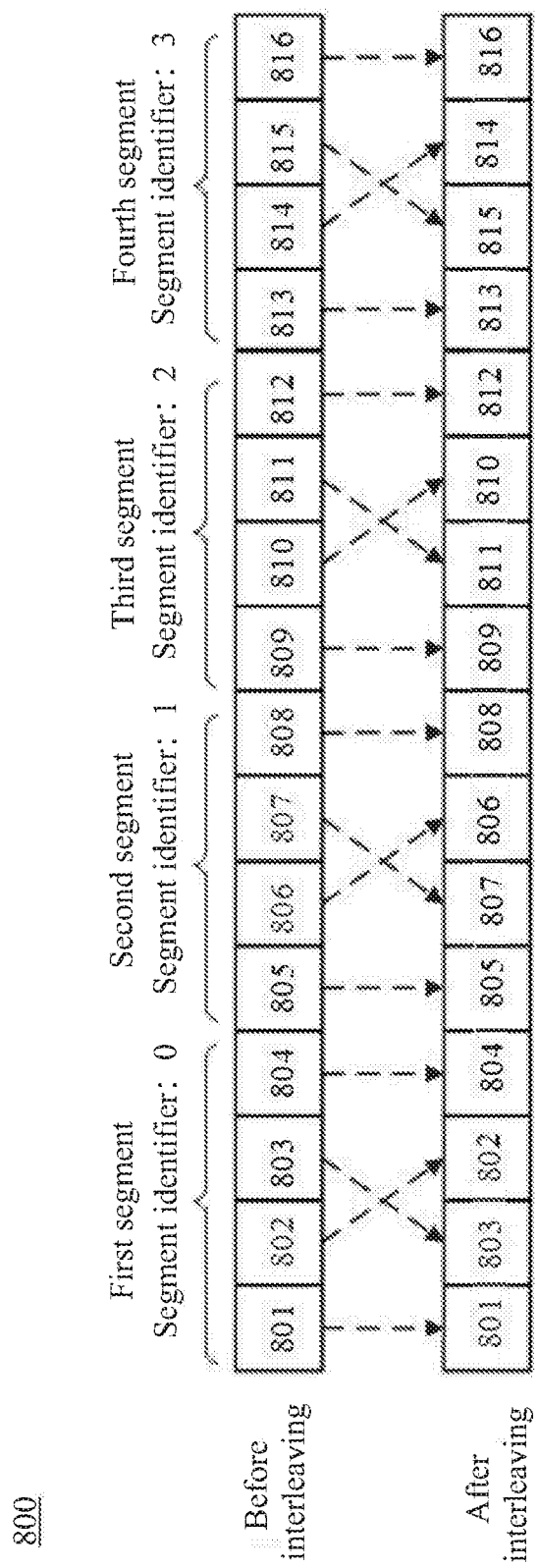
FIG. 8 shows another schematic diagram of performing intra-segment interleaving and inter-segment interleaving on a plurality of segments to generate an interleaved bit sequence.

FIG. 8 shows another schematic diagram of performing intra-segment and inter-segment interleaving on the plurality of segments to generate the interleaved bit sequence in step S103. As shown in FIG. 8, 4 segments are obtained in step S102, and the segment identifiers of the 4 segments are respectively [0, 1, 2, 3]. Each segment includes 4 bits, that is, the first segment includes bits 801 to 804, the second segment includes bits 805 to 808, the third segment includes bits 809 to 812, and the fourth segment includes bits 813 to 816. Then, in step S103, for each of the 4 segments, intra-segment interleaving is performed according to the intra-segment interleaving order [0, 2, 1, 3], and then inter-segment interleaving is performed on the 4 segments according to the inter-segment interleaving order [0, 2, 1, 3], to finally generate the interleaved bit sequence.

In addition, according to another example of the present disclosure, when the intra-segment interleaving order within one segment is determined through the plurality of manners of determining the interleaving order described above, one or more segments in the plurality of manners of determining the interleaving order described above may also be replaced with one or more bits within one segment, so that the intra-segment interleaving order within one segment may also be determined.

With the rate matching interleaving method for the polar codes provided in the embodiments, before performing channel interleaving and modulation on the codeword bit sequence, the codeword bit sequence is segmented, so that the wireless communication system may process one or more segments with a shorter length rather than one codeword bit sequence with a longer length, thereby simplifying the implementation of the wireless communication system. In addition, after the codeword bit sequence is segmented, intra-segment or inter-segment interleaving is performed on one or more segments, which reduces burst errors in bit transmission and improves the performance of the wireless communication system, such as a bit error rate.

Figure 9:
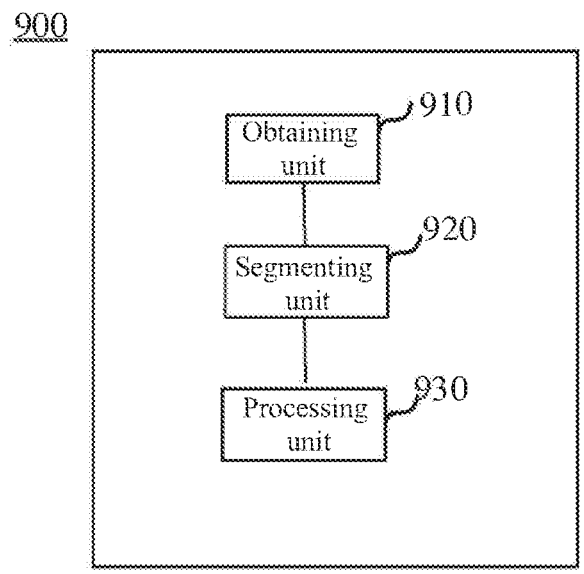
FIG. 9 shows a schematic diagram of structure of an apparatus for performing the method shown in FIG. 1 according to embodiments of the present disclosure.

Hereinafter, an apparatus for performing the method 100 shown in FIG. 1 according to the embodiments of the present disclosure is described with reference to FIG. 9. FIG. 9 is a schematic diagram of structure of an apparatus 900 for performing the method 100 shown in FIG. 1.

As shown in FIG. 9, the apparatus 900 includes an obtaining unit 910 configured to obtain a first codeword bit sequence. The apparatus 900 further includes a segmenting unit 920 configured to divide the first codeword bit sequence to obtain one or more segments. The apparatus 900 further includes a processing unit 930 configured to perform intra-segment and/or inter-segment interleaving on the one or more segments to generate an interleaved bit sequence. In addition to these three units, the device 900 may include other components. However, since these components are not related to the content of the embodiment of the present disclosure, their illustration and description are omitted here.

In addition, since the specific details of the following operations performed by the device 900 according to the embodiments of the present disclosure are the same as those described above with reference to FIGS. 2-8, repeated descriptions of the same details are omitted here to avoid repetition.

According to one example of the embodiment, the first codeword bit sequence obtained by the obtaining unit 910 may be a codeword bit sequence output by a Polar encoder. For example, the Polar encoder encodes an information bit sequence to generate the codeword bit sequence (also referred to as a mother code codeword bit sequence for a polar code)

According to one example, the first codeword bit sequence obtained by the obtaining unit 910 may include a plurality of bits. For example, the first codeword bit sequence may include 8 bits, or 16 bits, and so on.

According to an example of the embodiment, the segmenting unit 920 dividing the first codeword bit sequence to obtain one or more segments may include: dividing the first codeword bit sequence according to a predetermined segmentation pattern to obtain one or more segments, where the number of bits included in the one or more segments is identical to the number of bits included in corresponding segments obtained by dividing a second codeword bit sequences according to the predetermined segmentation pattern, and the length of the first codeword bit sequence is different from the length of the second codeword bit sequence.

In this example, the predetermined segmentation pattern may be a predetermined number of bits included in respective segments. For example, the segmenting unit 920 divides the first codeword bit sequence or the second codeword bit sequence according to the predetermined number of bits included in respective segments to obtain one or more segments. After division, the number of bits included in the respective segments may be the same or different.

The case where segmenting is performed according to the predetermined segmentation pattern and the number of bits included in respective segments of the same codeword bit sequence after the division may be the same or different is similar to the examples shown in FIG. 2 and FIG. 3 described above, and will not be repeated here.

According to another example of the embodiment, the segmenting unit 920 dividing the first codeword bit sequence to obtain one or more segments may further include: dividing the first codeword bit sequence to obtain a plurality of segments, wherein the number of bits included in at least one segment of the plurality of segments is different from the number of bits included in other segments of the plurality of segments.

For example, when the obtaining unit 910 obtains a first codeword bit sequence with a length of 8, the segmenting unit 920 may obtain 3 segments by dividing the first codeword bit sequence, where the first segment includes 2 bits, the second segment includes 4 bits, and the third segment includes 2 bits.

In this example, the segmenting unit 920 may perform a first division for the first codeword bit sequence to obtain a plurality of first segments, where the number of bits included in each first segment is the same, and then merge at least two adjacent first segments of the plurality of first segments into one second segment, and then the second segment and other first segments other than the at least two adjacent first segments in the plurality of first segments form a plurality of segments obtained by dividing the first codeword bit sequence. For example, when the obtaining unit 910 obtains the first codeword bit sequence with the length of 8, the segmenting unit 920 performs the first division for the first codeword bit sequence with the length of 8 to obtain 4 first segments, where the number of bits included in each of the first segments is 2. The second first segment and the third first segment in the four first segments are merged by the segmenting unit 920 into one second segment, and then the number of bits included in the second segment is 4. Therefore, the second segment, the first first segment and the fourth first segment form 3 segments obtained by dividing the codeword bit sequence with the length of 8.

Then, the processing unit 930 performs intra-segment and/or inter-segment interleaving on the one or more segments to generate an interleaved bit sequence.

The processing unit 930 may perform intra-segment and/or inter-segment interleaving on the one or more segments in a plurality of manners to generate the interleaved bit sequence. For example, segment identifiers of the plurality of segments may be permuted by regular permuting rules to determine an order for inter-segment and/or inter-segment interleaving on one or more segments. As another example, the order for inter-segment and/or inter-segment interleaving on one or more segments may also be determined by a randomly generated order. For another example, for different segments in one or more segments, different manners may also be used to determine the order for inter-segment and/or inter-segment interleaving.

According to one example of present embodiments, the process of a method of the processing unit 930 performing intra-segment and/or inter-segment interleaving on the one or more segments to generate an interleaved bit sequence is as follows:

The processing unit 930 generates an initial binary sequence number of each segment according to a segment identifier of the segment in the one or more segments, where each initial binary sequence number includes a plurality of bits.

According to one example of the embodiments, each segment in one or more segments may be assigned a segment identifier, where the segment identifier may be a decimal sequence number. The processing unit 930 converts the decimal sequence number of each segment into a corresponding binary sequence number.

For example, as described above, the segmenting unit 920 divides the codeword bit sequence with the length of 16 according to the predetermined segmentation pattern and obtains 8 segments, and the segment identifiers of the 8 segments are respectively [0, 1, 2, 3, 4, 5, 6, 7]. The processing unit 930 converts the segment identifiers of the 8 segments into corresponding binary sequence numbers, which are respectively [000, 001, 010, 011, 100, 101, 110, 111]. That is, the initial binary sequence numbers of the 8 segments are respectively [000, 001, 010, 011, 100, 101, 110, 111], and the initial binary sequence number of each segment includes 3 bits.

Then, the processing unit 930 sweeps positions of a part of the plurality of bits of the initial binary sequence number to generate a permuted binary sequence number.

For example, as described above, in the example in which the processing unit 930 divides the codeword bit sequence with the length of 16 and obtains 8 segments, and the initial binary sequence number of each segment includes 3 bits, the processing unit 930 sweeps the positions of the first bit and second bit of the 3 bits of the initial binary sequence number of each segment to generate the permuted binary sequence number. That is, the permuted binary sequence numbers of the 8 segments are respectively [000, 001, 100, 101, 010, 011, 110, 111].

The processing unit 930 then determines the order for inter-segment and/or inter-segment interleaving according to the permuted binary sequence number.

For example, as described above, in the case where the permuted binary sequence numbers of the 8 segments generated by the processing unit 930 are respectively [000, 001, 100, 101, 010, 011, 110, 111], the order for inter-segment and/or inter-segment interleaving may be determined by the processing unit 930 according to the decimal sequence numbers [0, 1, 4, 5, 2, 2, 3, 6, 7] corresponding to the permuted binary sequence numbers. Of course, the order for inter-segment and/or inter-segment interleaving may also be directly determined according to the permuted binary sequence numbers, which is not limited in the present disclosure Then, the processing unit 930 performs intra-segment and/or inter-segment interleaving on the one or more segments according to the determined order to generate the interleaved bit sequence.

For example, when the order determined by the processing unit 930 as described above is [0, 1, 4, 5, 2, 2, 3, 6, 7], the processing unit 930 performs intra-segment and/or inter-segment interleaving on the 8 segments according to the order [0, 1, 4, 5, 2, 3, 6, 7] to generate the interleaved bit sequence.

The above description has been made based on the example of swapping two bits of the plurality of bits of the initial binary sequence number, however the present disclosure is not limited to this. Alternatively, more bits among the plurality of bits of the initial binary sequence number may be swapped. For example, in the above described example of dividing the codeword bit sequence with the length of 16 and obtaining 8 segments, all 3 bits included in the binary sequence number may be swapped.

Specifically, the processing unit 930 may first swap the positions of the first bit and the third bit of the 3 bits of each initial binary sequence number, and then swap the positions of the second bit and the third bit to generate the permuted binary sequence number. That is, the permuted binary sequence numbers of the 8 segments are respectively [000, 100, 001, 101, 010, 110, 011, 111].

Then, the processing unit 930 may determine the order for intra-segment and/or inter-segment interleaving according to the decimal sequence numbers [0, 4, 1, 5, 2, 6, 3, 7] corresponding to the permuted binary sequence numbers.

Then, the processing unit 930 performs intra-segment and/or inter-segment interleaving on the 8 segments according to the order [0, 4, 1, 5, 2, 6, 3, 7] to generate the interleaved bit sequence.

The above describes the method in which the processing unit 930 determines the interleaving order according to the binary sequence numbers corresponding to the segment identifiers. However, according to the embodiments of the present disclosure, the interleaving order may be determined according to other methods.

According to another example of present embodiments, the process of a method of the processing unit 930 performing intra-segment and/or inter-segment interleaving on the one or more segments to generate the interleaved bit sequence is as follows:

The processing unit 930 generates an initial matrix corresponding to the number of the one or more segments.

In this example, the initial matrix generated by the processing unit 930 may be a generation matrix for the polar codes. For example, according to the number of the one or more segments, a generation matrix used when the polar code encoder encodes an information bit sequence with a length of the number of one or more segments is generated, and then the generation matrix may be used as the initial matrix.

For example, as described above, in the case where the segmenting unit 920 divides the codeword bit sequence with the length of 16 and obtains 8 segments according to the predetermined segmentation pattern, and the polar code encoder uses an 8×8 matrix when encoding the information bit sequence with the length of 8, the processing unit 930 generates the 8×8 generation matrix, and uses the 8×8 generation matrix as the initial matrix. FIG. 6A shows a schematic diagram of the 8×8 initial matrix, and column numbers 1 to 8 of the 8×8 initial matrix correspond to segment identifiers 0 to 7 of the 8 segments, respectively.

In addition, in this example, the generation manners of the generation matrix may be any generation manners in the prior art, and details are not described herein.

Then, the processing unit 930 determines a current target column with a column weight of 1 in columns of the initial matrix, and obtains an interleaving sequence number according to a column number of the determined current target column.

For example, as described above, in the case where the processing unit 930 generates the 8×8 initial matrix, then the processing unit 930 determines that the current target column with a column weight of 1 in the columns of the initial matrix is the eighth column, and obtains one interleaving sequence number 7 according to a column number of the eighth column Then, the processing unit 930 deletes the current target column and a row corresponding to the current target column to generate a reduction matrix.

For example, as described above, in the case where the processing unit 930 has determined that the current target column with a column weight of 1 in the columns of the initial matrix is the eighth column, the processing unit 930 deletes the eighth column and the eighth row to generate the reduction matrix.

Then, the processing unit 930 determines the current target column with a column weight of 1 in the reduction matrix, and obtains an interleaving sequence number according to the column number of the current target column.

For example, as described above, in the case where the processing unit 930 has generated the 7×7 reduction matrix, the processing unit 930 determines that the current target column with a column weight of 1 in the columns of the reduction matrix is the sixth column, and obtains one interleaving sequence number 5 according to the column number of the sixth column.

Then, the processing unit 930 judges whether the column numbers of all columns in the initial matrix have obtained interleaving sequence numbers. If not, the current target column and the row corresponding to the current target column being deleted to generate a reduction matrix, and a current target column with a column weight of 1 in the reduction matrix being determined, and an interleaving sequence number being obtained according to a column number of the current target column are repeatedly. If yes, the operation of sequentially arranging the interleaving sequence number is performed.

For example, as described above, in the case where the processing unit 930 has determined that the current target column with a column weight of 1 in the columns of the reduction matrix is the sixth column, and deleted the sixth column and sixth row to generate a 6×6 reduction matrix, then the processing unit 930 determines that the current target column with a column weight of 1 in the columns in the 6×6 reduction matrix is the fourth column, and obtains one interleaving sequence number 3 according to the column number of the fourth column. The above processes are repeated until the interleaving sequence numbers are obtained according to the column numbers of all the columns in the 8×8 initial matrix.

Then, the processing unit 930 sequentially arranges the obtained interleaving sequence numbers to determine the order for intra-segment and/or inter-segment interleaving.

For example, in the above example, it is assumed that the interleaving sequence numbers [7, 5, 3, 6, 4, 2, 1, 0] are sequentially obtained according to the initial matrix and the reduction matrixes. The processing unit 930 may arrange the interleaving sequence numbers [7, 5, 3, 6, 4, 2, 1, 0] in a positive order to determine the order for the intra-segment and/or inter-segment interleaving as [7, 5, 3, 6, 4, 2, 1, 0]. Alternatively, the interleaving sequence numbers [7, 5, 3, 6, 4, 2, 1, 0] may also be arranged in a reverse order to determine the order for the intra-segment and/or inter-segment interleaving as [0, 1, 2, 4, 6, 3, 5, 7].

Then, the processing unit 930 performs intra-segment and/or inter-segment interleaving on the one or more segments according to the determined order to generate the interleaved bit sequence.

For example, as described above, in the case where the processing unit 930 determines that the order for intra-segment and/or inter-segment interleaving is [7, 5, 3, 6, 4, 2, 1, 0] or [0, 1, 2, 4, 6, 3, 5, 7], the processing unit 930 may perform intra-segment and/or inter-segment interleaving on these eight segments in the order of [7, 5, 3, 6, 4, 2, 1, 0] or [0, 1, 2, 4, 6, 3, 5, 7] to generate the interleaved bit sequence.

In addition, in this example, during the processing by the processing unit 930 as described above, when there are more than one current target columns with a column weight of 1 in the columns of the initial matrix or the reduction matrix, one current target column may be randomly selected, or one current target column may be selected according to certain agreed conditions.

The two different methods for determining the interleaving order are described above. However, according to the embodiments of the present disclosure, the processing unit 930 may also determine the interleaving order according to other methods. For example, the segmenting unit 920 may divide the first codeword bit sequence to obtain N segments, where N is a positive integer greater than or equal to 2. In this case, the processing unit 930 may perform inter-segment interleaving on the N segments to generate the interleaved bit sequence, where a sum of a segment identifier of the i-th segment and a segment identifier of the (N-i+1)-th segment in the interleaved bit sequence is equal to a sum of a segment identifier of the i-th segment and a segment identifier of the (N-i+1)-th segment before interleaving, and i is a positive integer.

Here is one specific example for illustration. For example, the segmenting unit 920 divides the first codeword bit sequence and obtains 16 segments, and the segment identifiers of the 16 segments are 0 to 15. Then the processing unit 930 may perform inter-segment interleaving on the 16 segments according to a predetermined interleaving order, such as [0,1,4,8,5,2,6,3,12,9,13,10,7,11,14,15], to generate the interleaved bit sequence. Moreover, before interleaving, the sum of the segment identifier "0" of the first segment and the segment identifier ("15") of the sixteenth segment is equal to 15, and the sum of the segment identifier ("1") of the second segment and the segment identifier ("14") of the fifteenth segment is equal to 15, and the sum of the segment identifier ("7") of the eighth segment and the segment identifier ("8") of the ninth segment is equal to 15. After interleaving, the sum of the segment identifier ("0") of the first segment and the segment identifier ("15") of the sixteenth segment in the interleaved bit sequence is still equal to 15, and the sum of the segment identifier ("1") of the second segment and the segment identifier ("14") of the fifteenth segment is still equal to 15, . . . , and the sum of the segment identifier ("3") of the eighth segment and the segment identifier ("12") of the ninth segment is still equal to 15.

In other words, the interleaving order that may ensure the sum of the segment identifier of the i-th segment and the segment identifier of the (N-i+1)-th segment in the interleaved bit sequence after interleaving is the same as that before the interleaving may be the predetermined interleaving order described herein, and the i is a positive integer and N is a positive integer greater than or equal to 2. In addition, according to another example of the present disclosure, the processing unit 930 may also perform intra-segment and/or inter-segment interleaving on the one or more segments in other manners different from any manners described above, so as to generate the interleaved bit sequence.

According to another example of the present disclosure, the processing unit 930 may perform intra-segment and/or inter-segment interleaving on the one or more segments according to a randomly generated order to generate the interleaved bit sequence. In practical applications, the randomly generated order may be an order generated by a random number generator.

According to another example of the present disclosure, the processing unit 930 may determine the order for intra-segment and/or inter-segment interleaving according to at least a part of an order of frozen bits. Then, intra-segment and/or inter-segment interleaving is performed on the one or more segments according to the determined order to generate the interleaved bit sequence. According to one example of the present disclosure, the frozen bits are bits predetermined by a transmitter and a receiver and used when a polarizer encoder encodes the information bit sequence, and the order of frozen bits may be an arrangement order for the frozen bits.

In this example, the processing unit 930 may determine the order for intra-segment and/or inter-segment interleaving according to all or a part of the arrangement order for the frozen bits, and then perform intra-segment and/or inter-segment interleaving on the one or more segments according to the determined order to generate the interleaved bit sequence. According to another example of the present disclosure, the processing unit 930 may determine the intra-segment and/or inter-segment interleaving order according to the interleaving order used by the interleaved bit sequence that has been interleaved; and perform intra-segment and/or inter-segment interleaving on the one or more segments according to the determined order, to generate an interleaved bit sequence. In practical applications, the interleaving order used by the interleaved interleaving bit sequence that has been interleaved may be stored and then be used to determine the intra-segment and/or inter-segment interleaving order for other codeword bit sequences.

In addition, according to another example of the present disclosure, the processing unit 930 performing intra-segment and/or inter-segment interleaving on the one or more segments to generate the interleaved bit sequence may further include: performing intra-segment interleaving on the one or more segments to generate the interleaved bit sequence, and an interleaving order for at least a part of segments in the one or more segments is different from an interleaving order for other part of segments in the one or more segments.

For example, for at least a part of segments in the plurality of segments, the interleaving order for the at least a part of segments in the plurality of segments may be determined according to a determination manner different from that of other parts of segments in the plurality of segments. For instance, for the 8 segments obtained by the segmenting unit 920, the intra-interleaving order for the 2 segments of the 8 segments may be determined by the processing unit 930 according to one (for example, the process 400 shown in FIG. 4) of the plurality of manners of determining the interleaving order described above. However, for the other 6 segments of the 8 segments, the intra-interleaving order may be determined by the processing unit 930 according to another (for example, the process 500 shown in FIG. 5) of the plurality of manners of determining the interleaving order described above.

In addition, according to another example of the present disclosure, in the case where the segmenting unit 920 divides the first codeword bit sequence to obtain the plurality of segments, the processing unit 930 may perform inter-segment interleaving on the plurality of segments to generate the interleaved bit sequence, and the interleaving order for at least a part of segments in the plurality of segments is different from the interleaving order for other parts of segments in the plurality of segments.

For example, for at least a part of segments in the plurality of segments, the interleaving order for at least a part of segments in the plurality of segments may be determined according to a determination manner different from that of other parts of the plurality of segments. For example, for the 8 segments obtained by the segmenting unit 920, the inter-interleaving order for the 4 segments of the 8 segments may be determined by the processing unit 930 according to one (for example, the randomly generated order) of the multiple manners of determining the interleaving order described above. However, for the other 4 segments of the 8 segments, the inter-interleaving order may be determined by the processing unit 930 according to another (for example, at least a part of an order for the frozen bits) of the multiple manners of determining the interleaving order described above.

In addition, according to another example of the embodiments, the processing unit 930 may perform intra-segment interleaving on the one or more segments to generate the interleaved bit sequence. For example, in the case where the 8 segments are obtained by the segmenting unit 920, the processing unit 930 may perform intra-segment interleaving on the one of the 8 segments to generate the interleaved bit sequence. According to another example, in the case where the 8 segments are obtained by the segmenting unit 920, the processing unit 930 may perform intra-segment interleaving on each of the 8 segments to generate the interleaved bit sequence.

In addition, according to another example of the present disclosure, in the case where the first codeword bit sequence is divided by the segmenting unit 920 to obtain the plurality of segments, the processing unit 930 may perform inter-segment interleaving on the plurality of segments to generate the interleaved bit sequence, or perform intra-segment and inter-segment interleaving on the plurality of segments to generate the interleaved bit sequence.

In this example, the performing intra-segment and inter-segment interleaving on the plurality of segments to generate the interleaved bit sequence may be performing both intra-segment and inter-segment interleaving on the plurality of segments to generate the interleaved bit sequence in consideration of both intra-segment interleaving order and inter-segment interleaving order at the same time. Alternatively, the performing intra-segment and inter-segment interleaving on the plurality of segments to generate the interleaved bit sequence may also be performing intra-segment interleaving on the plurality of segments according to the intra-segment interleaving order, and then performing inter-segment interleaving on the plurality of segments after intra-segment interleaving according to the inter-segment interleaving order. Alternatively, the performing intra-segment and inter-segment interleaving on the plurality of segments to generate the interleaved bit sequence may also be performing inter-segment interleaving on the plurality of segments according to the inter-segment interleaving order, and then performing intra-segment interleaving on the plurality of segments after inter-segment interleaving according to the intra-segment interleaving order. The specific example is similar to the example shown in FIG. 7 and FIG. 8 described above, and is not repeated here.

In addition, according to another example of the present disclosure, when the intra-segment interleaving order within one segment is determined by the processing unit 930 through the plurality of manners of determining the interleaving order described above, one or more segments in the plurality of manners of determining the interleaving order described above may also be replaced with one or more bits within one segment, so that the intra-segment interleaving order within one segment may also be determined.

With the rate matching interleaving apparatus for the polar codes provided in the embodiment, before performing channel interleaving and modulation on the codeword bit sequence, the codeword bit sequence is segmented, so that the wireless communication system may process one or more segments with a shorter length rather than one codeword bit sequence with a longer length, thereby simplifying the implementation of the wireless communication system. In addition, after the codeword bit sequence is segmented, intra-segment or inter-segment interleaving is performed on one or more segments, which reduces burst errors in bit transmission and improves the performance of the wireless communication system, such as a bit error rate.

It should be noted that block diagrams used for the illustration of the above embodiments represent blocks in units. These structural units may be realized by any combination of hardware and/or software. In addition, the means for implementing respective structural units is not particularly limited. That is, respective structural units may be realized by one apparatus that is physically and/or logically aggregated, or may be realized by directly and/or indirectly (for example, wired and/or wireless) connecting two or more physically and/or logically separate apparatuses and using the plurality of apparatuses.

Figure 10:
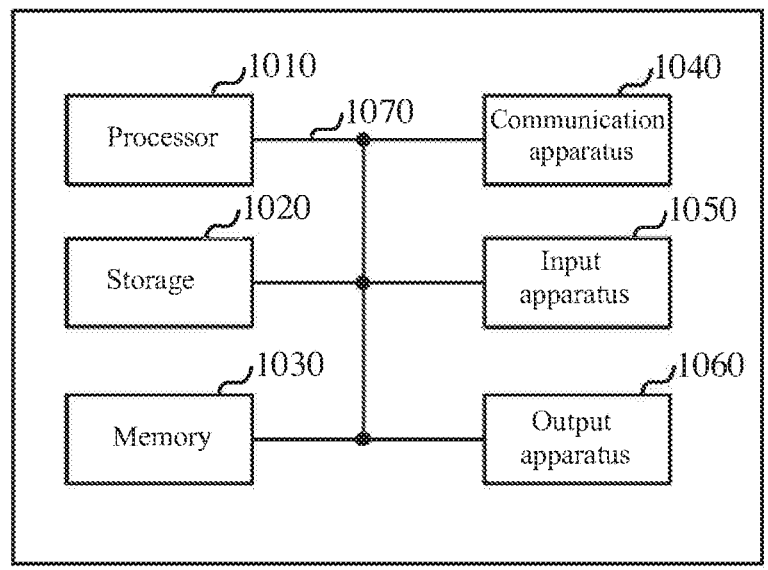
FIG. 10 shows a schematic diagram of hardware structure of a related user equipment according to embodiments of the present disclosure.

For example, devices such as the user equipment and the like in the embodiment of the present disclosure can function as a computer that executes processing of the reference signal transmitting method for beam management of the present disclosure. FIG. 10 is a schematic diagram illustrating an example of a hardware configuration of a related user equipment 1000 according to one embodiment of the present disclosure. The above described user equipment 1000 may be physically designed as a computer apparatus including a processor 1010, a storage 1020, a memory 1030, a communication apparatus 1040, an input apparatus 1050, an output apparatus 1060, and a bus 1070 and the like.

It should be noted that, in the following description, the word "apparatus" may be replaced by "circuit", "device", "unit" and so on. It should be noted that the hardware structure of a user equipment 1000 may be designed to include one or more of each apparatus shown in the drawings, or may be designed not to include part of the apparatus.

For example, although only one processor 1010 is shown, a plurality of processors may be provided. Furthermore, processes may be implemented with one processor, or processes may be implemented either simultaneously or in sequence, or in different manners, on two or more processors. It should be noted that the processor 1010 may be implemented with one or more chips.

Each function of the user equipment 1000 is implemented by reading predetermined software (program) on hardware such as the processor 1010 and the memory 1020, so as to make the processor 1010 perform calculations, and by controlling the communication performed by the communication apparatus 1040, and the reading and/or writing of data in the memory 1020 and the storage 1030.

The processor 1010 may control the whole computer by, for example, running an operating system. The processor 1010 may be configured with a central processing unit (CPU), which includes interfaces with peripheral apparatus, control apparatus, computing apparatus, a register and so on. For example, the base band processing unit and the call processing unit may be implemented through the processor 1010.

Furthermore, the processor 1010 reads programs (program codes), software modules or data, from the storage 1030 and/or the communication apparatus 1040, into the memory 1020, and executes various processes according to these. As for the programs, programs to allow computers to execute at least part of the operations of the above-described embodiments may be used. For example, control unit of user equipment 1000 may be implemented by a control program stored in the memory 1020 and operated by the processor 1010, and may also be implemented similarly for other function blocks.

The memory 1020 is a computer-readable recording medium, and may be constituted by, for example, at least one of a ROM (Read Only Memory), an EPROM (Erasable Programmable ROM), an EEPROM (Electrically EPROM), a RAM (Random Access Memory) and/or other appropriate storage media. The memory 1020 may be referred to as a "register", a "cache", a "main memory" (primary storage apparatus) and so on. The memory 1020 can store executable programs (program codes), software modules and so on for implementing the wireless communication methods according to embodiments of the present disclosure.

The storage 1030 is a computer-readable recording medium, and may be constituted by, for example, at least one of a flexible disk, a floppy (registered trademark) disk, a magneto-optical disk (for example, a compact disc (CD-ROM (Compact Disc ROM) and so on), a digital versatile disc, a Blu-ray (registered trademark) disk), a removable disk, a hard disk drive, a smart card, a flash memory device (for example, a card, a stick, a key drive, etc.), a magnetic stripe, a database, a server, and/or other appropriate storage media. The storage 1030 may be referred to as "secondary storage apparatus."

The communication apparatus 1040 is hardware (transmitting/receiving device) for allowing inter-computer communication by using wired and/or wireless networks, and may be referred to as, for example, a "network device", a "network controller", a "network card", a "communication module" and so on. The communication apparatus 1040 may be configured to include a high frequency switch, a duplexer, a filter, a frequency synthesizer and so on in order to realize, for example, frequency division duplex (FDD) and/or time division duplex (TDD). For example, the above transmitting and receiving antennas, amplification unit, transmitting and receiving unit, and transmission path interface may be realized through the communication apparatus 1040.

The input apparatus 1050 is an input device for receiving input from the outside (for example, a keyboard, a mouse, a microphone, a switch, a button, a sensor and so on). The output apparatus 1060 is an output device for allowing sending output to the outside (for example, a display, a speaker, an LED (Light Emitting Diode) lamp and so on). It should be noted that the input apparatus 1050 and the output apparatus 1060 may be provided in an integrated structure (for example, a touch panel).

Furthermore, these pieces of apparatus, including the processor 1010, the memory 1020 and so on are connected by the bus 1070 so as to communicate information. The bus 1070 may be formed with a single bus, or may be formed with buses that vary between pieces of apparatus.

Also, the user equipment 1000 may be structured to include hardware such as a microprocessor, a digital signal processor (DSP), an ASIC (Application-Specific Integrated Circuit), a PLD (Programmable Logic Device), an FPGA (Field Programmable Gate Array) and so on, and part or all of the functional blocks may be implemented by the hardware. For example, the processor 1010 may be installed with at least one of these pieces of hardware.

The terms illustrated in the present specification and/or the terms required for the understanding of the present specification may be substituted with terms having the same or similar meaning. For example, a channel and/or a symbol may be a signal. In addition, the signal may be a message. A reference signal may be abbreviated as an "RS (Reference Signal)", and may be referred to as a "pilot", a "pilot signal" and so on, depending on which standard applies. In addition, a component carrier (CC) may be referred to as a carrier frequency, a cell, or the like.

In addition, the wireless frame may be composed of one or more periods (frames) in the time domain. Each of the one or more periods (frames) constituting the wireless frame may also be referred to as a subframe. Further, a subframe may be composed of one or more slots in the time domain. The subframe may be a fixed length of time duration (eg, 1 ms) that is independent of the numerology.

Furthermore, a slot may be comprised of one or more symbols in the time domain (OFDM (Orthogonal Frequency Division Multiplexing) symbols, SC-FDMA (Single Carrier Frequency Division Multiple Access) symbols, and so on). Furthermore, the slot may also be a time unit configured based on parameter. Furthermore, a slot may also include multiple microslots. Each microslot may be comprised of one or more symbols in the time domain. Furthermore, a microslot may also be referred as "a subframe".

A wireless frame, a subframe, a slot, a microslot and a symbol all represent the time unit when transmitting signals. A wireless frame, a subframe, a slot, a microslot and a symbol may also use other names that correspond to each other. For example, one subframe may be referred to as a "transmission time interval (TTI)", and a plurality of consecutive subframes may also be referred to as a "TTI", and one slot or one microslot may also be referred to as a "TTI." That is, a subframe and/or a TTI may be a subframe (1 ms) in existing LTE, may be a shorter period than 1 ms (for example, one to thirteen symbols), or may be a longer period of time than 1 ms. It should be noted that a unit indicating a TTI may also be referred to as a slot, a microslot, or the like instead of a subframe.

Here, a TTI refers to the minimum time unit of scheduling in wireless communication, for example. For example, in LTE systems, a wireless base station schedules the wireless resources (such as the frequency bandwidth and transmission power that can be used in each user terminal) to allocate to each user terminal in TTI units. It should be noted that the definition of TTIs is not limited to this.

TTIs may be channel-coded data packets (transport blocks), code blocks, and/or codeword transmission time units, or may be the unit of processing in scheduling, link adaptation and so on. It should be noted that, when a TTI is given, the time interval (e.g., the number of symbols) actually mapped to the transport block, code block, and/or codeword may also be shorter than the TTI.

It should be noted that, when one slot or one microslot is called a TTI, more than one TTI (i.e., more than one slot or more than one microslot) may also become the scheduled minimum time unit. Furthermore, the number of slots (the number of microslots) constituting the minimum time unit of the scheduling may be controlled.

A TTI having a time duration of 1 ms may be referred to as a "normal TTI" (TTI in LTE Rel. 8 to 12), a "standard TTI", a "long TTI", a "normal subframe", a "standard subframe", or a "long subframe", and so on. A TTI that is shorter than a normal TTI may be referred to as a "shortened TTI", a "short TTI", a "partial (or fractional) TTI", a "shortened subframe", a "short subframe", a "microslot", or a "short microslot" and so on.

It should be noted that, a long TTI (eg, a normal TTI, a subframe, etc.) may be replaced with a TTI having a time duration exceeding 1 ms, and a short TTI (eg, a shortened TTI, and so on) may also be replaced with a TTI having a TTI duration shorter than the long TTI and a TTI duration exceeding 1 ms.

A resource block (RB) is the unit of resource allocation in the time domain and the frequency domain, and may include one or a plurality of consecutive subcarriers in the frequency domain. Also, an RB may include one or more symbols in the time domain, and may be one slot, one microslot, one subframe or one TTI duration. One TTI and one subframe each may be comprised of one or more resource blocks, respectively. It should be noted that one or more RBs may also be referred to as a "physical resource block (PRB (Physical RB))", a "SubCarrier Group (SCG)", a "Resource Element Group (REG)", a "PRG pair", an "RB pair" and so on.

Also, a resource block may also be composed of one or more resource elements (RE). For example, one RE can be a wireless resource area of a subcarrier and a symbol.

It should be noted that the above-described structures of wireless frames, subframes, slots, microslots and symbols and so on are simply examples. For example, configurations such as the number of subframes included in a wireless frame, the number of slots of each subframe or wireless frame, the number or microslots included in a slot, the number of symbols and RBs included in a slot or microslot, the number of subcarriers included in an RB, the number of symbols in a TTI, the symbol duration and the cyclic prefix (CP) duration can be variously changed.

Also, the information and parameters and so on described in this specification may be represented in absolute values or in relative values with respect to predetermined values, or may be represented in corresponding other information. For example, radio resources may be indicated by predetermined indices. In addition, equations to use these parameters and so on may be used, apart from those explicitly disclosed in this specification.

The names used for parameters and so on in this specification are not limited in any respect. For example, since various channels (PUCCH (Physical Uplink Control Channel), PDCCH (Physical Downlink Control Channel) and so on) and information elements can be identified by any suitable names, the various names assigned to these various channels and information elements are not limited in any respect.

The information, signals and so on described in this specification may be represented by using any one of various different technologies. For example, data, instructions, commands, information, signals, bits, symbols and chips, all of which may be referenced throughout the herein-contained description, may be represented by voltages, currents, electromagnetic waves, magnetic fields or particles, optical fields or photons, or any combination of these.

Also, information, signals and so on can be output from higher layers to lower layers and/or from lower layers to higher layers. Information, signals and so on may be input and/or output via a plurality of network nodes.

The information, signals and so on that are input and/or output may be stored in a specific location (for example, in a memory), or may be managed in a control table. The information, signals and so on that are input and/or output may be overwritten, updated or appended. The information, signals and so on that are output may be deleted. The information, signals and so on that are input may be transmitted to other apparatus.

Reporting of information is by no means limited to the aspects/embodiments described in this specification, and other methods may be used as well. For example, reporting of information may be implemented by using physical layer signaling (for example, downlink control information (DCI), uplink control information (UCI)), higher layer signaling (for example, RRC (Radio Resource Control) signaling, broadcast information (the master information block (MIB), system information blocks (SIBs) and so on), MAC (Medium Access Control) signaling and so on), and other signals and/or combinations of these.

It should be noted that physical layer signaling may also be referred to as L1/L2 (Layer 1/Layer 2) control information (L1/L2 control signals), L1 control information (L1 control signal) and so on. Also, RRC signaling may be referred to as "RRC messages", and can be, for example, an RRC connection setup message, RRC connection reconfiguration message, and so on. Also, MAC signaling may be reported using, for example, MAC control elements (MAC CEs (Control Elements)).

Also, reporting of predetermined information (for example, a reporting "X") does not necessarily have to be carried out explicitly, and can be carried out implicitly (by, for example, not reporting this piece of information, or by reporting a different piece of information).

Regarding decisions, which may be made in values represented by one bit (0 or 1), may be made by a true or false value (Boolean value) represented by true or false, or may be made by comparing numerical values (for example, comparison against a predetermined value).

Software, whether referred to as "software", "firmware", "middleware", "microcode" or "hardware description language", or called by other names, should be interpreted broadly, to mean instructions, instruction sets, code, code segments, program codes, programs, subprograms, software modules, applications, software applications, software packages, routines, subroutines, objects, executable files, execution threads, procedures, functions and so on.

Also, software, commands, information and so on may be transmitted and received via communication media. For example, when software is transmitted from a website, a server or other remote sources by using wired technologies (coaxial cables, optical fiber cables, twisted-pair cables, digital subscriber lines (DSL) and so on) and/or wireless technologies (infrared radiation, microwaves and so on), these wired technologies and/or wireless technologies are included in the definition of communication media.

The terms "system" and "network" as used herein are used interchangeably.

In the present specification, the terms "base station (BS)", "radio base station", "eNB", "gNB", "cell", "sector", "cell group", "carrier" and "component carrier" may be used interchangeably. A base station may be referred to as a "fixed station", "NodeB", "eNodeB (eNB)", "access point", "transmission point", "receiving point", "femto cell", "small cell" and so on.

A base station can accommodate one or more (for example, three) cells (also referred to as "sectors"). When a base station accommodates a plurality of cells, the entire coverage area of the base station can be partitioned into a plurality of smaller areas, and each smaller area can provide communication services with base station subsystems (for example, indoor small base stations (RRHs (Remote Radio Heads))). The term "cell" or "sector" refers to part or all of the coverage area of a base station and/or a base station subsystem that provides communication services within this coverage.

In the present specification, the terms "mobile station (MS)", "user terminal", "user equipment (UE)" and "terminal" may be used interchangeably. A mobile station is also sometimes used by those skilled in the art as a subscriber station, a mobile unit, a subscriber unit, a wireless unit, a remote unit, a mobile device, a wireless device, a wireless communication device, a remote device, a mobile subscriber station, an access terminal, a mobile terminal, a wireless terminal, a remote terminal, a handset, a user agent, a mobile client, a client, or some other suitable terms.

Furthermore, the radio base stations in this specification may be interpreted as user terminals. For example, each aspect/embodiment of the present disclosure may be applied to a configuration in which communication between a radio base station and a user terminal is replaced with communication among a plurality of user terminals (D2D (Device-to-Device)). In this case, the radio base station may have the functions of the user equipment. In addition, terms such as "uplink" and "downlink" may be interpreted as "side." For example, an uplink channel may be interpreted as a side channel.

Likewise, the user terminals in this specification may be interpreted as radio base stations. In this case, the radio base stations may have the functions of the user equipment described above.

In the present specification, it is assumed that certain actions to be performed by base station may, in some cases, be performed by its higher node (upper node). In a network comprised of one or more network nodes with base stations, it is clear that various operations that are performed to communicate with terminals can be performed by base stations, one or more network nodes (for example, MMEs (Mobility Management Entities), S-GW (Serving-Gateways), and so on may be possible, but these are not limiting) other than base stations, or combinations of these.

The respective aspects/embodiments illustrated in this specification may be used individually or in combinations, which may also be switched and used during execution. The order of processes, sequences, flowcharts and so on of the respective aspects/embodiments described in the present specification may be re-ordered as long as inconsistencies do not arise. For example, although various methods have been illustrated in this specification with various components of steps in exemplary orders, the specific orders that are illustrated herein are by no means limiting.

The aspects/embodiments illustrated in this specification may be applied to systems that use LTE (Long Term Evolution), LTE-A (LTE-Advanced), LTE-B (LTE-Beyond), SUPER 3G, IMT-Advanced, 4G (4th generation mobile communication system), 5G (5th generation mobile communication system), FRA (Future Radio Access), New-RAT (Radio Access Technology), NR (New Radio), NX (New radio access), FX (Future generation radio access), GSM (registered trademark) (Global System for Mobile communications), CDMA 2000 (Code Division Multiple Access), UMB (Ultra Mobile Broadband), IEEE 802.11 (Wi-Fi (registered trademark)), IEEE 802.16 (WiMAX (registered trademark)), IEEE 920.20, UWB (Ultra-WideBand), Bluetooth (registered trademark) and other adequate radio communication methods, and/or next-generation systems that are enhanced based on these.

The phrase "based on" as used in this specification does not mean "based only on", unless otherwise specified. In other words, the phrase "based on" means both "based only on" and "based at least on."

Any reference to elements with designations such as "first", "second" and so on as used herein does not generally limit the number/quantity or order of these elements. These designations are used only for convenience, as a method of distinguishing between two or more elements. In this way, reference to the first and second elements does not imply that only two elements may be employed, or that the first element must precede the second element in some way.

The terms "judge" and "determine" as used herein may encompass a wide variety of actions. For example, to "judge" and "determine" as used herein may be interpreted to mean making judgements and determinations related to calculating, computing, processing, deriving, investigating, looking up (for example, searching a table, a database or some other data structure), ascertaining and so on. Furthermore, to "judge" and "determine" as used herein may be interpreted to mean making judgements and determinations related to receiving (for example, receiving information), transmitting (for example, transmitting information), inputting, outputting, accessing (for example, accessing data in a memory) and so on. In addition, to "judge" and "determine" as used herein may be interpreted to mean making judgements and determinations related to resolving, selecting, choosing, establishing, comparing and so on. In other words, to "judge" and "determine" as used herein may be interpreted to mean making judgements and determinations related to some action.

As used herein, the terms "connected" and "coupled", or any variation of these terms, mean all direct or indirect connections or coupling between two or more elements, and may include the presence of one or more intermediate elements between two elements that are "connected" or "coupled" to each other. The coupling or connection between the elements may be physical, logical or a combination of these. For example, "connection" may be interpreted as "access." As used herein, two elements may be considered "connected" or "coupled" to each other by using one or more electrical wires, cables and/or printed electrical connections, and, as a number of non-limiting and non-inclusive examples, by using electromagnetic energy, such as electromagnetic energy having wavelengths in radio frequency fields, microwave regions and optical (both visible and invisible) regions.

When terms such as "including", "comprising" and variations of these are used in this specification or in claims, these terms are intended to be inclusive, in a manner similar to the way the term "provide" is used. Furthermore, the term "or" as used in this specification or in claims is intended to be not an exclusive disjunction.

Now, although the present disclosure has been described in detail above, it should be obvious to a person skilled in the art that the present disclosure is by no means limited to the embodiments described herein. The present disclosure can be implemented with various corrections and in various modifications, without departing from the spirit and scope of the present disclosure defined by the recitations of claims. Consequently, the description herein is provided only for the purpose of explaining examples, and should by no means be construed to limit the present disclosure in any way.

What is claimed is:

1. A terminal comprising:
    a processor configured to perform rate matching for polar codes on a coded bit sequence, wherein the processor is configured to divide the coded bit sequence to obtain a plurality of segments and the number of bits included in each segment is an integral power of 2, and to perform intra-segment interleaving on the plurality of segments, wherein an interleaving order for at least one of the plurality of segments is different from interleaving orders for other segments of the plurality of segments; and
    a transmitter configured to transmit the rate matched coded bit sequence,
    wherein the number of bits included in at least one of the plurality of segments is different from the number of bits included in other segments of the plurality of segments.

2. A base station comprising:
    a processor configured to perform rate matching for polar codes on a coded bit sequence, wherein the processor is configured to divide the coded bit sequence to obtain a plurality of segments and the number of bits included in each segment is an integral power of 2, and to perform intra-segment interleaving on the plurality of segments, wherein an interleaving order for at least one of the plurality of segments is different from interleaving orders for other segments of the plurality of segments; and
    a transmitter configured to transmit the rate matched coded bit sequence,
    wherein the number of bits included in at least one of the plurality of segments is different from the number of bits included in other segments of the plurality of segments.

3. A method performed by a terminal, the method comprising:
    performing rate matching for polar codes on a coded bit sequence, wherein the performing rate matching for polar codes on a coded bit sequence comprises:
        dividing the coded bit sequence to obtain a plurality of segments and the number of bits included in each segment is an integral power of 2, and performing intra-segment interleaving on the plurality of segments, wherein an interleaving order for at least one of the plurality of segments is different from interleaving orders for other segments of the plurality of segments; and transmitting the rate matched coded bit sequence, wherein the number of bits included in at least one of the plurality of segments is different from the number of bits included in other segments of the plurality of segments.

4. A system comprising a terminal and a base station, wherein:

the terminal comprises:

a first processor configured to perform rate matching for polar codes on a first coded bit sequence, wherein the first processor is configured to divide the first coded bit sequence to obtain a plurality of segments and the number of bits included in each segment is an integral power of 2, and to perform intra-segment interleaving on the plurality of segments, wherein an interleaving order for at least one of the plurality of segments is different from interleaving orders for other segments of the plurality of segments; and a first transmitter configured to transmit the rate matched first coded bit sequence, wherein the number of bits included in at least one of the plurality of segments divided by the first processor is different from the number of bits included in other segments of the plurality of segments divided by the first processor; and the base station comprises:

a second processor configured to perform rate matching for polar codes on a second coded bit sequence, wherein the second processor is configured to divide the second coded bit sequence to obtain a plurality of segments and the number of bits included in each segment is an integral power of 2, and to perform intra-segment interleaving on the plurality of segments, wherein an interleaving order for at least one of the plurality of segments is different from interleaving orders for other segments of the plurality of segments; and a second transmitter configured to transmit the rate matched second coded bit sequence, wherein the number of bits included in at least one of the plurality of segments divided by the second processor is different from the number of bits included in other segments of the plurality of segments divided by the second processor.

* * * * *